(12) United States Patent
Kim

(10) Patent No.: US 8,288,755 B2
(45) Date of Patent: Oct. 16, 2012

(54) LIGHT-EMITTING DEVICE, LIGHT-EMITTING ELEMENT AND METHOD OF MANUFACTURING SAME

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/099,869

(22) Filed: May 3, 2011

(65) Prior Publication Data
US 2011/0204325 A1 Aug. 25, 2011

Related U.S. Application Data

(62) Division of application No. 12/462,819, filed on Aug. 10, 2009, now Pat. No. 7,960,196.

(30) Foreign Application Priority Data

Sep. 10, 2008 (KR) .................. 10-2008-0089441

(51) Int. Cl.
*H01L 29/06* (2006.01)
*H01L 31/00* (2006.01)
(52) U.S. Cl. .................. 257/13; 257/79; 257/E33.068
(58) Field of Classification Search .................. 257/13
See application file for complete search history.

(56) References Cited

U.S. PATENT DOCUMENTS

| | | | |
|---|---|---|---|
| 6,312,967 B1 | 11/2001 | Ikeda | |
| 7,173,289 B1 | 2/2007 | Wu et al. | |
| 2005/0062049 A1 | 3/2005 | Lin et al. | |
| 2005/0179130 A1 | 8/2005 | Tanaka et al. | |
| 2005/0218416 A1 | 10/2005 | Cho et al. | |
| 2006/0273324 A1 | 12/2006 | Asai et al. | |
| 2007/0085093 A1 | 4/2007 | Ohmae et al. | |
| 2007/0221907 A1* | 9/2007 | Jang et al. | 257/13 |
| 2008/0121903 A1 | 5/2008 | Hiramatsu et al. | |
| 2008/0128734 A1 | 6/2008 | Hsieh et al. | |
| 2008/0142824 A1 | 6/2008 | Chen et al. | |
| 2008/0197342 A1 | 8/2008 | Lee et al. | |
| 2009/0057700 A1 | 3/2009 | Jin et al. | |
| 2010/0062554 A1 | 3/2010 | Kim | |

FOREIGN PATENT DOCUMENTS

| | | |
|---|---|---|
| KR | 10-2005-0096509 | 10/2005 |
| KR | 10-2006-0110521 | 10/2006 |
| KR | 10-2008-0029603 | 4/2008 |

OTHER PUBLICATIONS

"Light-Emitting Device, Light-Emitting Element and Method of Manufacturing Same" Specification, Drawings and Prosecution History, of U.S. Appl. No. 12/462,819, filed Aug. 10, 2009, by Yu-Sik Kim.

\* cited by examiner

*Primary Examiner* — Angel Roman
(74) *Attorney, Agent, or Firm* — Onello & Mello, LLP

(57) ABSTRACT

Provided are a light-emitting element and a light-emitting device, and methods of fabricating the same. The method of fabricating a light-emitting element includes forming a buffer layer on a substrate and forming photonic crystal patterns and a pad pattern on the buffer layer. Each of the pad pattern and the photonic crystal patterns are made of a metal material, and the pad pattern is physically connected to the photonic crystal patterns. Forming a light-emitting structure includes sequentially stacking a first conductive pattern of a first conductivity type, a light-emitting pattern, and a second conductive pattern of a second conductivity type on the buffer layer. And the method also includes forming a first electrode that is electrically connected to the first conductive pattern and forming a second electrode that is electrically connected to the second conductive pattern.

8 Claims, 27 Drawing Sheets

LIGHT-EMITTING DEVICE, LIGHT-EMITTING ELEMENT AND METHOD OF MANUFACTURING SAME

CROSS REFERENCE TO RELATED APPLICATION

This application is a divisional application of U.S. patent application Ser. No. 12/462,819, filed on Aug. 10, 2009, which claims the benefit of Korean patent application number 10-2008-0089441, filed on Sep. 10, 2008, in the Korean Intellectual Property Office, the contents of which applications are incorporated herein in their entirety by reference.

FIELD

The present invention relates to a light emitting element, light emitting device, and methods of making same.

BACKGROUND OF THE INVENTION

Light-emitting elements such as light-emitting diodes (LEDs) emit light when electrons combine with holes. Light-emitting elements consume low power, have a long life, can be installed in a limited space, and are resistant to vibrations.

A light-emitting element may include a light-emitting structure in which a GaN pattern of an n type, a light-emitting pattern, and a GaN pattern of a p type are stacked. Light is generated in the light-emitting pattern when carriers (e.g., electrons) of the GaN pattern of the n type combine with carriers (e.g., holes) of the GaN pattern of the p type.

A major challenge in the development of light-emitting elements is to improve light extraction efficiency. Light extraction efficiency denotes the proportion of light, which comes out of a light-emitting structure (into, for example, air or transparent resin that surrounds the light-emitting structure), in light generated within the light-emitting element. A light-emitting structure may have an optical refractive index of approximately 2.2 to 3.8, air may have an optical refractive index of 1, and transparent resin may have an optical refractive index of approximately 1.5.

For example, when a light-emitting structure has an optical refractive index of 3.4, a portion of light generated within the light-emitting structure may come out of the light-emitting structure into air at a critical angle of approximately 17 degrees and into transparent resin at a critical angle of approximately 26 degrees.

In this case, the light extraction efficiency of the light-emitting structure is approximately 2.2% when a portion of light generated within the light-emitting structure comes out of the light-emitting structure into air, and the light extraction efficiency of the light-emitting structure is approximately 4% when the portion of the light generated within the light-emitting structure comes out of the light-emitting structure into transparent resin. The other portion of the light is reflected by the surface of the light-emitting structure and trapped in the light-emitting structure.

A light-emitting structure may be made of a material containing $In_xAl_yGa_{(1-x-y)}N$ ($0 \leq x \leq 1$, $0 \leq y \leq 1$). In order to develop a light-emitting element using $In_xAl_yGa_{(1-x-y)}N$, it is important to form $In_xAl_yGa_{(1-x-y)}N$ having a low defect density. For example, $In_xAl_yGa_{(1-x-y)}N$ may be grown on a sapphire substrate. However, when the sapphire substrate is defective, $In_xAl_yGa_{(1-x-y)}N$ grown from the sapphire substrate may also be defective.

In addition, the entire region of a light-emitting pattern may not always be used equally. That is, only part of the light-emitting pattern may be used depending on the design of a light-emitting element. Thus, electric current may flow only in a specific region of the light-emitting pattern, and light may be emitted only from the specific region in which electric current flows. Consequently, the amount of light emitted may be reduced.

SUMMARY OF THE INVENTION

In accordance with aspects of the present invention, provided are methods of fabricating a light-emitting element and a light-emitting device that have improved light extraction efficiency, have reduced defect densities, and can emit an increased amount of light.

Aspects of the present invention also provide a light-emitting element and a light-emitting device that have improved light extraction efficiency, have reduced defect densities, and can emit an increased amount of light.

However, aspects of the present invention are not restricted to the one set forth herein. The above and other aspects of the present invention will become more apparent to one of ordinary skill in the art to which the present invention pertains by referencing the detailed description of the exemplary embodiments given below.

According to an aspect of the present invention, there is provided a method of fabricating a light-emitting element. The method includes: forming a buffer layer on a substrate; forming photonic crystal patterns and a pad pattern on the buffer layer, each of the pad pattern and the photonic crystal patterns being made of a metal material, including physically connecting the pad pattern to the photonic crystal patterns; forming a light-emitting structure, including sequentially stacking a first conductive pattern of a first conductivity type, a light-emitting pattern, and a second conductive pattern of a second conductivity type on the buffer layer; and forming a first electrode and electrically connecting the first electrode to the first conductive pattern and forming a second electrode and electrically connecting the second electrode to the second conductive pattern.

The method can include forming the photonic crystal patterns at substantially the same level as the pad pattern.

The photonic crystal patterns can be a plurality of repetitively formed patterns, and an interval between every two adjacent ones of the repetitive patterns is $\lambda/4$ and light generated by the light-emitting structure can have a wavelength of $\lambda$.

The photonic crystal patterns can be line patterns or mesh patterns.

The pad pattern can have a width of approximately 40 μm or less.

The second electrode can be formed on an upper surface and sidewalls of the light-emitting structure.

The forming of the light-emitting structure can comprise: sequentially forming a first conductive layer of the first conductivity type, a light-emitting layer, and a second conductive layer of the second conductivity type on the buffer layer; and patterning the second conductive layer, the light-emitting layer, and the first conductive layer to complete the light-emitting structure comprising the second conductive pattern, the light-emitting pattern, and the first conductive pattern. The first conductive pattern can be wider than the second conductive pattern and the light-emitting pattern and the first conductive pattern can have a protruding portion extending in a lateral direction, and the pad pattern can be disposed under the protruding portion of the first conductive pattern.

The forming of the first electrode can comprise: patterning part of the protruding portion of the first conductive pattern to expose the pad pattern; forming an ohmic layer on the exposed pad pattern; and forming the first electrode on the ohmic layer.

The method can further comprise: forming an insulating layer on the upper surface and sidewalls of the light-emitting structure after forming the light-emitting structure. The forming of the first electrode can comprise: etching a portion of the insulating layer to form a first opening that penetrates the insulating layer; etching a portion of the first conductive pattern to form a second opening that penetrates the first conductive pattern, the second opening being narrower than the first opening; forming an ohmic layer which at least partially fills the first opening and the second opening; and forming the first electrode on the ohmic layer.

The method can include wet-etching the portion of the insulating layer to form the first opening, and dry-etching the portion of the first conductive pattern to foam the second opening.

The forming of the first electrode and the second electrode can comprise: forming the second electrode on the light-emitting structure after forming the light-emitting structure; bonding the substrate to a conductive substrate such that the second electrode is disposed between the substrate and the conductive substrate; removing the substrate; and forming the first electrode on the buffer layer.

The forming of the first electrode on the buffer layer can comprise: etching a portion of the buffer layer to expose at least part of the pad pattern; forming an ohmic layer on the exposed portion of the pad pattern; and forming the first electrode on the ohmic layer.

The conductive substrate can have a larger surface area than the substrate.

According to aspects of the present invention, methods of fabricating a light-emitting device by using the above method are also provided.

According to another aspect of the present invention, there is provided a light-emitting element including: a buffer layer formed on a substrate; photonic crystal patterns and a pad pattern formed on the buffer layer, wherein each of the pad pattern and the photonic crystal patterns is made of a metal material, and the pad pattern is physically connected to the photonic crystal patterns; a light-emitting structure includes a first conductive pattern of a first conductivity type, a light-emitting pattern, and a second conductive pattern of a second conductivity type sequentially stacked on the buffer layer; a first electrode electrically connected to the first conductive pattern; and a second electrode electrically connected to the second conductive pattern.

The photonic crystal patterns can be formed at substantially the same level as the pad pattern.

According to another aspect of the present invention, there is provided a light-emitting element including: a conductive substrate; a second electrode formed on the conductive substrate; a light-emitting structure including a first conductive pattern of a first conductivity type, a light-emitting pattern, and a second conductive pattern of a second conductivity type sequentially stacked on the second electrode; photonic crystal patterns and a pad pattern formed on the first conductive pattern, wherein each of the pad pattern and the photonic crystal patterns is made of a metal material, and the pad pattern is physically connected to the photonic crystal patterns; a buffer layer formed on the first conductive pattern having an opening that exposes at least part of the pad pattern; and a first electrode which is formed on the exposed portion of the pad pattern.

The photonic crystal patterns can be formed at substantially the same level as the pad pattern.

The photonic crystal patterns can be a plurality of repetitive patterns, and an interval between every two adjacent ones of the repetitive patterns can be $\lambda/4$ when light generated by the light-emitting structure has a wavelength of $\lambda$.

The pad pattern can have a width of approximately 40 µm or less.

The first conductive pattern can be wider than the second conductive pattern and the light-emitting pattern and the first conductive pattern can have a protruding portion extending in a lateral direction, and the pad pattern can be disposed under the protruding portion of the first conductive pattern.

The light-emitting element can further comprise: an opening formed in the protruding portion of the first conductive pattern that exposes the pad pattern; and an ohmic layer formed on the exposed pad pattern, wherein the first electrode is formed on the ohmic layer.

The light-emitting element can further comprise: an insulating layer formed on an upper surface and sidewalls of the light-emitting structure; a first opening that penetrates the insulating layer; a second opening that penetrates the first conductive pattern and that is narrower than the first opening; and an ohmic layer that at least partially fills the first opening and the second opening, wherein the first electrode can be formed on the ohmic layer.

The second electrode can be bowl-shaped, and the light-emitting structure can be disposed within the second electrode.

The second electrode can have a protrusion, the light-emitting structure can be divided into a first side and a second side by the protrusion, the photonic crystal patterns of the first electrode can then be disposed on the first side of the light-emitting structure, and the pad pattern of the first electrode can then be disposed on the second side of the light-emitting structure.

According to aspects of the present invention, there are provided various light-emitting devices including any one of the above light-emitting elements.

BRIEF DESCRIPTION OF THE DRAWINGS

The above and other aspects and features of the present invention will become more apparent by describing in detail exemplary embodiments in accordance therewith with reference to the attached drawings, in which.

DETAILED DESCRIPTION

Figure 1:
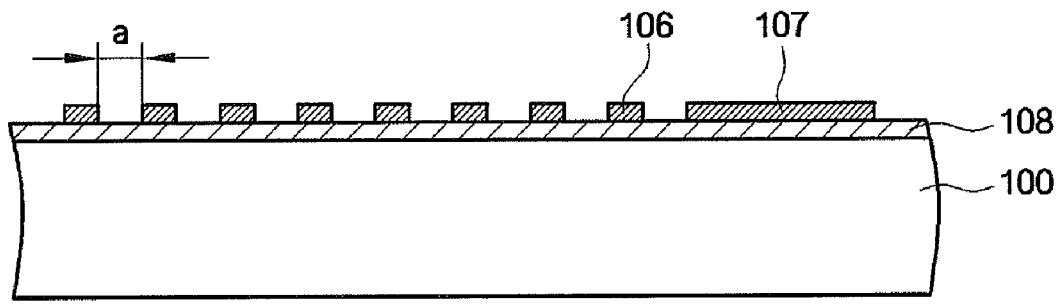
FIGS. 1 through 9 are views for explaining a first exemplary embodiment of processes included in a method of fabricating a light-emitting element according to aspects of the present invention.

The present invention may be understood more readily by reference to the following detailed description of exemplary embodiments in accordance therewith and the accompanying drawings. The present invention may, however, be embodied in many different forms and should not be construed as being limited to the embodiments set forth herein. Like reference numerals refer to like elements throughout the specification. In the drawings, the size and relative size of the layers and regions are exaggerated for clarity.

It will be understood that when an element or layer is referred to as being "on" another element or layer, the element or layer can be directly on another element or layer or intervening elements or layers. In contrast, when an element or layer is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe the relationship of one element or component to another element(s) or component(s) as illustrated in the figures. It will be understood that the spatially relative terms are intended to encompass different orientations of the device in use or operation, in addition to the orientation depicted in the figures. Throughout the specification, like reference numerals in the drawings denote like elements, and thus their description will be omitted.

Embodiments in accordance with the invention are described herein with reference to plan and cross-section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of an element and are not intended to limit the scope of the invention.

Figure 2:
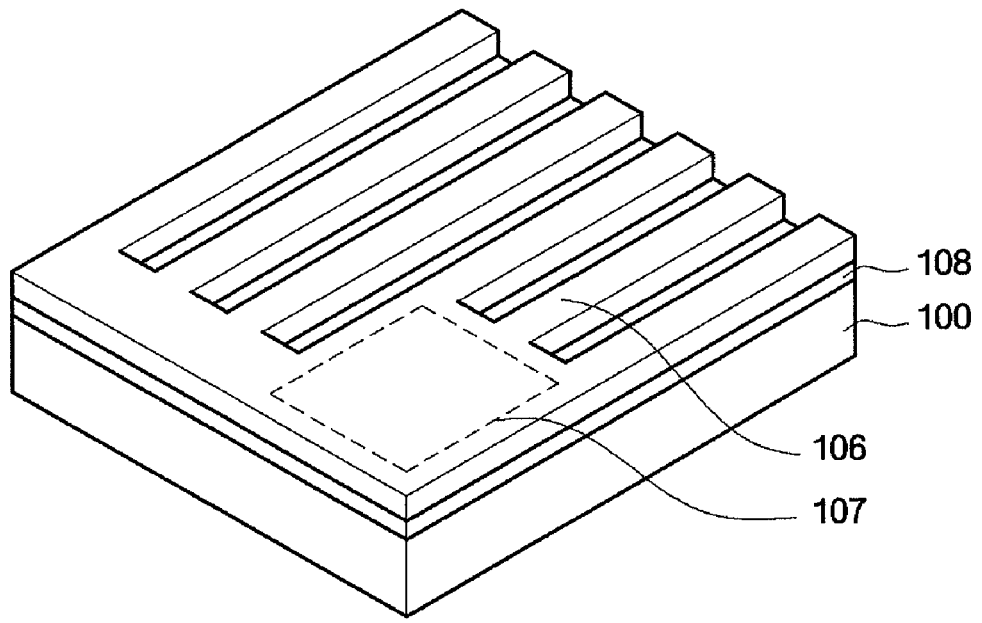
Figure 3:
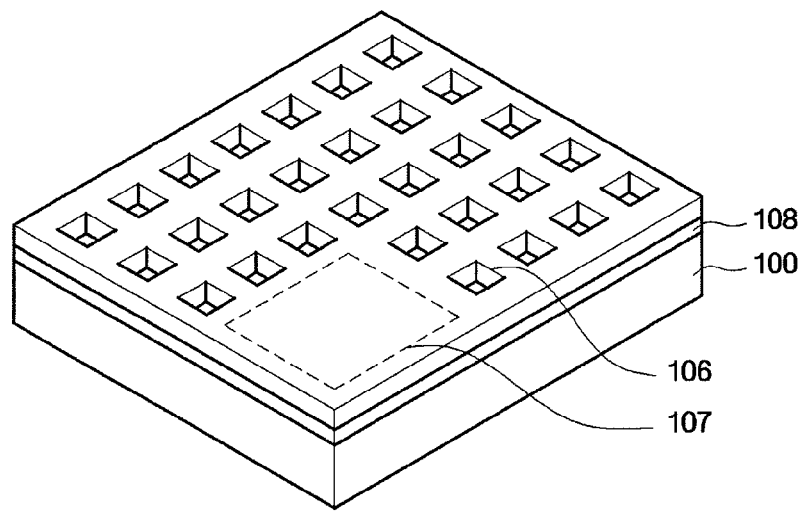
Figure 6:
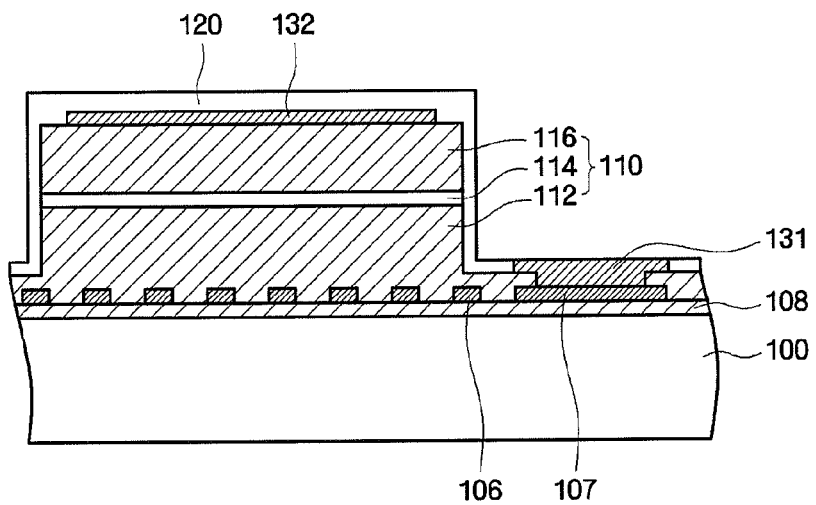
Figure 7:
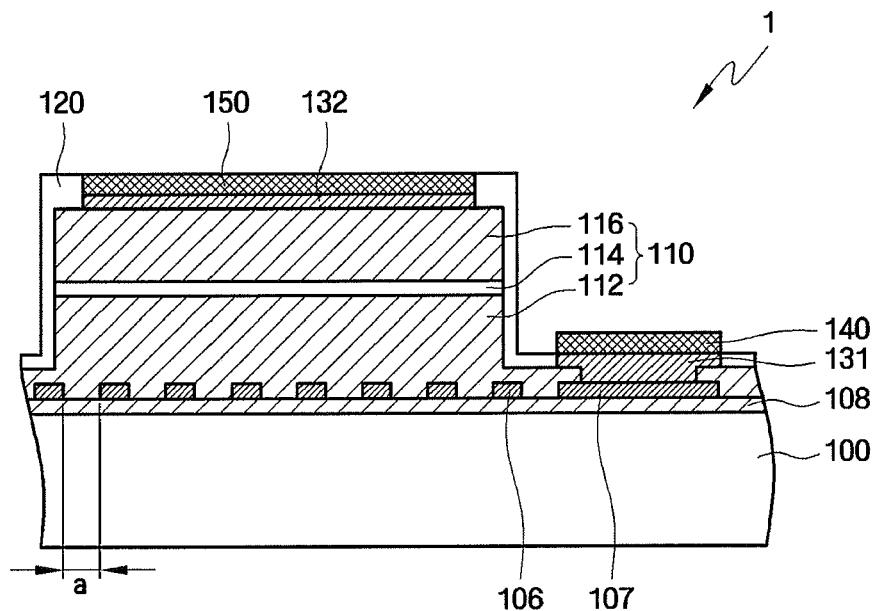
Figure 8:
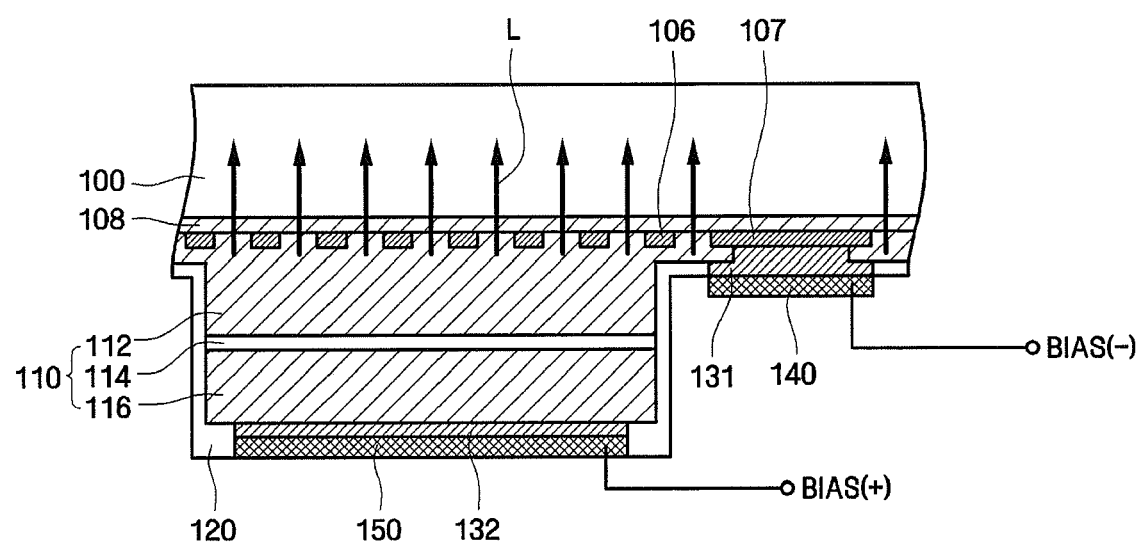
Figure 9:
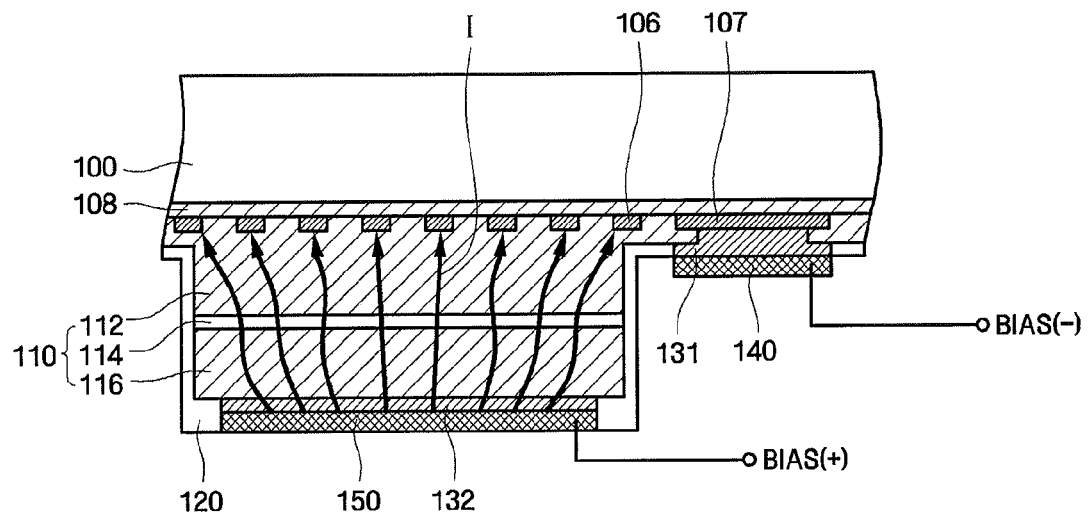

FIGS. 1 through 9 are views for explaining processes included in a first exemplary embodiment of a method of fabricating a light-emitting element 1 (see FIG. 7) according to aspects of the present invention. In particular, FIGS. 2 and 3 show examples of photonic crystal patterns 106 of FIG. 1. In addition, FIGS. 8 and 9 are views for explaining the operation of the light-emitting element 1 according to the first exemplary embodiment. The light-emitting element 1 according to the first exemplary embodiment may be of a lateral type or a flip-chip type.

Referring to FIG. 1, a buffer layer 108 is formed on a substrate 100. Specifically, the buffer layer 108 may be used as a seed layer for forming a first conductive layer 112a, a light-emitting layer 114a and a second conductive layer 116a, which will be described herein below. In addition, the buffer layer 108 is used to prevent a lattice mismatch between the substrate 100 and a light-emitting structure 110 (see FIG. 5), which will also be described herein below. Thus, the buffer layer 108 improves the membranous properties of the light-emitting structure 110 (see FIG. 5).

The buffer layer 108 may be made of any material that can make the buffer layer 108 serve as a seed layer. For example, the buffer layer 108 may be made of $In_xAl_yGa_{(1-x-y)}N$ ($0 \leq x \leq 1$, $0 \leq y \leq 1$) or $Si_xC_yN_{(1-x-y)}$ ($0 \leq x \leq 1$, $0 \leq y \leq 1$).

The buffer layer 108 may be grown on the substrate 100 by metal organic chemical vapor deposition (MOCVD), liquid phase epitaxy, hydride vapor phase epitaxy, molecular beam epitaxy, metal organic vapor phase epitaxy (MOVPE), or the like.

Next, the photonic crystal patterns 106 and a pad pattern 107 are formed on the buffer layer 108.

The photonic crystal patterns 106 allow light generated by the light-emitting structure 110 (see FIG. 5) to easily come out of the light-emitting element 1. That is, the photonic crystal patterns 106 can improve the light extraction efficiency of the light-emitting element 1.

The photonic crystal patterns 106 may be a plurality of repetitive (or periodic) patterns. The photonic crystal patterns 106 may have various shapes. For example, the photonic crystal patterns 106 may be line patterns (see FIG. 2) or may be mesh patterns (see FIG. 3). The photonic crystal patterns 106 may be arranged at predetermined intervals denoted by "a". When light generated by the light-emitting structure 110 has a wavelength of λ, the interval "a" between every two adjacent ones of the photonic crystal patterns 106 may be λ/4. Here, the interval "a" between every two adjacent ones of the photonic crystal patterns 106 may be controlled based on λ/4, that is, may be controlled to be substantially λ/4, with small variations tolerable.

The pad pattern 107 is used to receive power from a first electrode 140 (see FIG. 7) which will be described later. When the pad pattern 107 is too big, it is difficult to grow the first conductive layer 112a (see FIG. 4), the light-emitting layer 114a (see FIG. 4), and the second conductive layer 116a (see FIG. 4). That is, when, for example, the first conductive layer 112a is grown by liquid phase epitaxy, hydride vapor phase epitaxy, molecular beam epitaxy, or the like, it may fail to grow enough to completely cover an upper surface of the pad pattern 107. Therefore, the pad pattern 107 must be sized appropriately. For example, the pad pattern 107 may have a width of approximately 40 μm or less.

As shown in FIGS. 1 through 3, the photonic crystal patterns 106 may be formed at substantially the same level as the pad pattern 107. This is possible because the photonic crystal patterns 106 and the pad pattern 107 can be formed simultaneously, in some embodiments.

The photonic crystal patterns 106 may be physically connected to the pad pattern 107. Therefore, when power is applied to the pad pattern 107 via the first electrode 140, it is also delivered to the photonic crystal patterns 106. Since power is applied to the photonic crystal patterns 106 in this way, the flow of a bias current (e.g., electric current) can be adjusted appropriately, which will be described in detail later with reference to FIG. 9.

The photonic crystal patterns 106 may be physically connected to the pad pattern 107 as shown in FIGS. 2 and 3. However, the present invention is not limited thereto. That is, the photonic crystal patterns 106 may be physically connected to the pad pattern 107 in ways other than the ways shown in FIGS. 2 and 3. In addition, the photonic crystal patterns 106 may be patterns other than those shown in FIGS. 2 and 3.

Each of the pad pattern 107 and the photonic crystal patterns 106 may be made of a metal material such as a metal material having high transparency or a metal material having high reflectivity. Examples of the metal material having high transparency may include indium tin oxide (ITO) and zinc oxide (ZnO), and examples of the metal material having high reflectivity may include silver (Ag), aluminum (Al), rhodium (Rh), nickel-aurum (NiAu), palladium (Pd), and titanium-platinum (TiPt).

The substrate 100 may be made of any material from which the buffer layer 108, the first conductive layer 112a, the light-emitting layer 114a, and the second conductive layer 116a can grow. For example, the substrate 100 may be an insulating substrate made of sapphire ($Al_2O_3$) or ZnO or may be a conductive substrate made of silicon (Si), silicon carbide (SiC), or gallium nitride (GaN).

Figure 4:
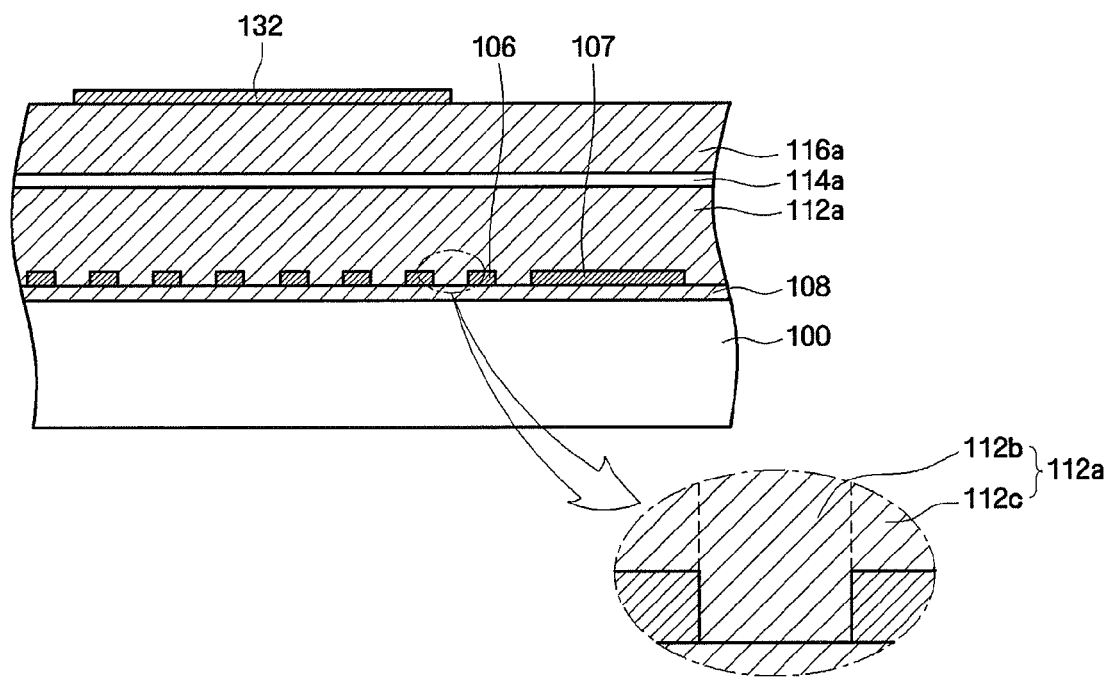

Referring to FIG. 4, the first conductive layer 112a, the light-emitting layer 114a, and the second conductive layer 116a are sequentially stacked on the buffer layer 108 having the photonic crystal patterns 106 and the pad pattern 107.

Specifically, each of the first conductive layer 112a, the light-emitting layer 114a, and the second conductive layer 116a may include $In_xAl_yGa_{(1-x-y)}N$ ($0 \leq x \leq 1$, $0 \leq y \leq 1$). For example, each of the first conductive layer 112a, the light-emitting layer 114a, and the second conductive layer 116a may be AlGaN or InGaN.

The first conductive layer 112a, the light-emitting layer 114a, and the second conductive layer 116a may be sequentially formed by MOCVD, liquid phase epitaxy, hydride vapor phase epitaxy, molecular beam epitaxy, MOVPE, or the like.

Specifically, the first conductive layer 112a may have a first conductivity type (e.g., an n type), and the second conductive layer 116a may have a second conductivity type (e.g., a p type). Conversely, the first conductive layer 112a may be of the second conductivity type (the p type), and the second conductive layer 116a may be of the first conductivity type (the n type), depending on the embodiment of the light-emitting element 1.

The light-emitting layer 114a is a region where light is generated when carriers (e.g., electrons) of the first conductive layer 112a combine with carriers (e.g., holes) of the second conductive layer 116a. Although not specifically shown in the drawings, the light-emitting layer 114a may include a well layer and a barrier layer. Since the well layer has a smaller band gap than the barrier layer, the carriers (electrons and holes) gather in the well layer and combine together. The light-emitting layer 114a may have a single quantum well (SQW) structure or a multiple quantum well (MQW) structure, depending on the number of well layers included in the light-emitting layer 114a. The SQW structure includes only one well layer while the MQW structure includes a plurality of well layers. In order to control light-emitting properties, at least one of the well layer and the barrier layer may be doped with at least one of boron (B), phosphorous (P), Si, magnesium (Mg), zinc (Zn), selenium (Se), and Al.

After the second conductive layer 116a is formed, the substrate 100 having the second conductive layer 116a may be annealed to activate the second conductive layer 116a. The substrate 100 may be annealed at a temperature of, e.g., approximately 400° C. Specifically, when the second conductive layer 116a is $In_xAl_yGa_{(1-x-y)}N$ doped with Mg, if the substrate 100 having the second conductive layer 116a is annealed, hydrogen (H) combined with Mg is reduced. As a result, the second conductive layer 116a shows p-type properties more clearly.

The first conductive layer 112a may include a vertical conductive layer 112b which is disposed between every two adjacent ones of the photonic crystal patterns 106 and a lateral conductive layer 112c which is disposed on each of the photonic crystal patterns 106. Here, the term "vertical" denotes a direction substantially perpendicular to a surface of the substrate 100, and the term "lateral" denotes a direction substantially parallel to the surface of the substrate 100.

The vertical conductive layer 112b is grown from a portion of the substrate 100 exposed between every two adjacent ones of the photonic crystal patterns 106. The horizontal conductive layer 112c extends from the vertical conductive layer 112b onto each of the photonic crystal patterns 106. The lateral conductive layer 112c corresponds to an over-growth region (or a lateral-growth region). The lateral conductive layer 112c has a relatively lower defect density than the vertical conductive layer 112b. For example, the lateral conductive layer 112c may have a defect density of $10^4$ $cm^{-2}$.

The photonic crystal patterns 106 may be used to improve light extraction efficiency as described above or may be used to form the first conductive layer 112a, the light-emitting layer 114a, and the second conductive layer 116a which have low defect densities. Since the light-emitting layer 114a and the second conductive layer 116a are grown from the first conductive layer 112a having a low defect density, they also have low defect densities.

A second ohmic layer 132 is formed on the second conductive layer 116a. The second ohmic layer 132 may include at least one of ITO, Zn, ZnO, Ag, Ti, Al, Au, Ni, indium oxide ($In_2O_3$), tin oxide ($SnO_2$), copper (Cu), tungsten (W), and Pt.

Figure 5:
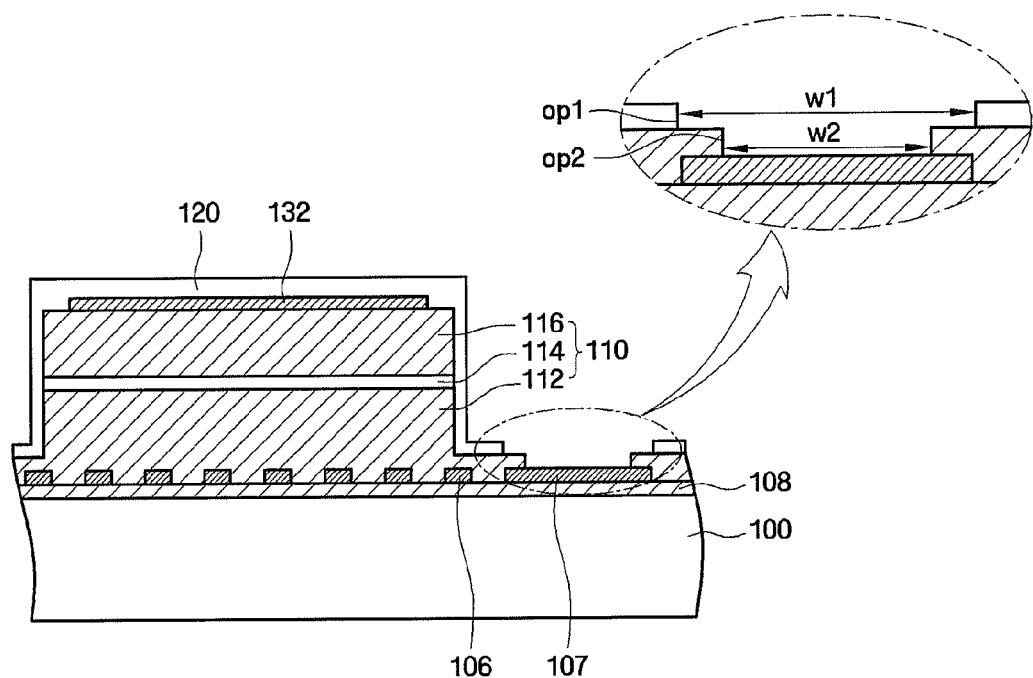

Referring to FIG. 5, the second conductive layer 116a, the light-emitting layer 114a, and the first conductive layer 112a are patterned to form the light-emitting structure 110 which includes a first conductive pattern 112, a light-emitting pattern 114, and a second conductive pattern 116. Although not shown in the drawing, a lower portion of the light-emitting structure 110 may be wider than an upper portion thereof. Thus, the light-emitting structure 110 may have inclined sidewalls. In addition, the first conductive pattern 112 may be wider than the second conductive pattern 116 and the light-emitting pattern 114. Thus, the first conductive pattern 112 may have a protruding portion in a lateral direction. The pad pattern 107 may be disposed under the protruding portion of the first conductive pattern 112.

Next, an insulating layer 120 is formed on the upper surface and sidewalls of the light-emitting structure 110. Then, a portion of the insulating layer 120, which is disposed on the pad pattern 107, is etched to form a first opening op1 that penetrates the insulating layer 120. In addition, a portion of the first conductive pattern 112, which is disposed on the pad pattern 107, is etched to form a second opening op2 that penetrates the first conductive pattern 112.

Specifically, the portion of the insulating layer 120 may be wet-etched to form the first opening op1, and the portion of the first conductive pattern 112 may be dry-etched to form the second opening op2. Here, the wet-etching process and the dry-etching process may be performed by using the same mask (e.g., a photoresist pattern). Although the same mask is used to perform the wet-etching process and the dry-etching process, since an undercut is formed in the wet-etching process, a width W2 of the second opening op2 may be less than a width w1 of the first opening op1.

Referring to FIG. 6, a first ohmic layer 131 may be formed to at least partially fill the first and second openings op1 and op2. Specifically, the first ohmic layer 131 may include at least one of ITO, Zn, ZnO, Ag, Ti, Al, Au, Ni, $In_2O_3$, $SnO_2$, Cu, W, and Pt. In order to activate the first ohmic layer 131, the substrate 100 having the first ohmic layer 131 may be annealed at a temperature of, e.g., approximately 400° C.

As described above, the width W1 of the first opening op1 may be greater than the width w2 of the second opening op2. In this case, an area, in which the first ohmic layer 131 filling the first and second openings op1 and op2 contacts the first conductive pattern 112, is increased (that is, is wider than when the width w1 of the first opening op1 is equal to the width w2 of the second opening op2). When the area, in which the first ohmic layer 131 filling the first and second openings op1 and op2 contacts the first conductive pattern 112, is increased as described above, power received from the first electrode 140 (see FIG. 7) can better be delivered to the first conductive pattern 112.

Referring to FIG. 7, the insulating layer 120 is etched to expose the second ohmic layer 132. Then, a second electrode 150 is formed on the exposed second ohmic layer 132, and the first electrode 140 is formed on the first ohmic layer 131.

When the light-emitting element 1 according to the first exemplary embodiment is fabricated to be of the flip-chip type, the second electrode 150 may be made of a material having a high reflectivity. For example, the second electrode 150 may be made of Ag or Al to reflect light generated by the light-emitting structure 110 so that the light can proceed toward the photonic crystal patterns 106. In order to maximize the reflective properties of the second electrode 150, the area of the second electrode 150 may be more than at least half the area of an upper surface of the second conductive pattern 116. As the area of the second electrode 150 is increased, the amount of light reflected by the second electrode 150 may increase.

When the light-emitting element 1 according to the first exemplary embodiment is fabricated to be of the lateral type, the second electrode 150 may be made of a material having a high transparency. For example, the second electrode 150 may be made of ITO so that light generated by the light-emitting structure 110 can pass through the second electrode 150 out of the light-emitting element 1. In order to maximize transmissive properties of the second electrode 150, the area of the second electrode 150 may be minimized, for example, to an area (a diameter of 50 μm) that enables wire bonding.

The light-emitting element 1 according to the first exemplary embodiment of the present invention will now be described in more detail with reference to FIG. 7. The light-emitting element 1 according to the first exemplary embodiment can be fabricated by using the method described above with reference to FIGS. 1 through 6.

Referring to FIG. 7, the light-emitting element 1 according to the first exemplary embodiment includes the buffer layer 108, the photonic crystal patterns 106, the pad pattern 107, the light-emitting structure 110, the first electrode 140, and the second electrode 150. The buffer layer 108 is formed on the substrate 100. The photonic crystal patterns 106 and the pad pattern 107 are formed on the buffer layer 108, made of metal materials, and are physically connected to each other. The light-emitting structure 110 includes the first conductive pattern 112 of the first conductivity type, the light-emitting pattern 114, and the second conductive pattern 116 of the second conductivity type, which are sequentially stacked on the buffer layer 108. The buffer layer also has the photonic crystal patterns 106 and the pad pattern 107 disposed thereon. The first electrode 140 is electrically connected to the first conductive pattern 112, and the second electrode 150 is electrically connected to the second conductive pattern 116.

In particular, the interval "a" between every two adjacent ones of the photonic crystal patterns 106 may be $\lambda/4$ when visible light generated by the light-emitting structure 110 has a wavelength of $\lambda$. Here, the interval "a" between every two adjacent ones of the photonic crystal patterns 106 may be controlled based on $\lambda/4$, that is, may be substantially $\lambda/4$, with small variations tolerable. Since the photonic crystal patterns 106 affect the optical path, they may be arranged such that light can easily come out of the light-emitting element 1, thereby improving the light extraction efficiency of the light-emitting element 1.

Specifically, ultraviolet (UV) light and/or visible light may be generated by the light-emitting structure 110. For example, when the light-emitting structure 110 generates visible light having a wavelength of 400 to 800 nm, the interval "a" between every two adjacent ones of the photonic crystal patterns 106 may be 100 to 400 nm, for example.

The operation of the light-emitting element 1 according to the first exemplary embodiment will now be described.

Referring to FIG. 8, when the first conductive pattern 112 is of the n type and when the second conductive pattern 116 is of the p type, a first bias BIAS(−) is applied to the first conductive pattern 112 via the first electrode 140, the first ohmic layer 131, the pad pattern 107 and the photonic crystal patterns 106, and a second bias BIAS(+) is applied to the second conductive pattern 116 via the second electrode 150 and the second ohmic layer 132. Conversely, although not shown in FIG. 8, when the first conductive pattern 112 is of the p type and when the second conductive pattern 116 is of the n type, the second bias BIAS(+) is applied to the first conductive pattern 112 via the first electrode 140, the first ohmic layer 131, the pad pattern 107 and the photonic crystal patterns 106, and the first bias BIAS(−) is applied to the second conductive pattern 116 via the second electrode 150 and the second ohmic layer 132.

Thus, the light-emitting structure 110 is forward-biased in this embodiment. The forward bias causes the light-emitting pattern 114 to generate light L. Although not shown in the drawing, the generated light L may be reflected by the second electrode 150 or may travel toward the photonic crystal patterns 106. The light L can easily come out of the light-emitting element 1 through the photonic crystal patterns 106. Specifically, since the photonic crystal patterns 106 induce paths of the light L, the light can easily come out of the light-emitting element 1, which, in turn, improves the light extraction efficiency of the light-emitting element 1.

Referring to FIG. 9, power applied to the first electrode 140 is delivered to the photonic crystal patterns 106 and the pad pattern 107, which are physically connected to each other. Thus, the flow of bias (e.g., electric current) between the first electrode 140 and the second electrode 150 can be adjusted selectively and appropriately.

Specifically, the photonic crystal patterns 106 are widely distributed between the first conductive pattern 112 and the substrate 100, and the first bias BIAS(−) is also applied to the photonic crystal patterns 106. Therefore, as shown in FIG. 9, electric current I, which flows from the second electrode 150 to the first electrode 140, may evenly flow in almost the entire region of the light-emitting structure 110. That is, light may be emitted from almost the entire region of the light-emitting pattern 114 of the light-emitting structure 110. Consequently, the amount of light emitted from the light-emitting element 1 can be increased.

FIGS. 10 through 14 are views for explaining processes included in a second exemplary embodiment of a method of fabricating a light-emitting element 2 (see FIG. 14) according to aspects of the present invention. The light-emitting element 2 according to the second exemplary embodiment of the present invention may be of the flip-chip type.

As shown in FIG. 1, a buffer layer 108 is formed on a substrate 100. Then, photonic crystal patterns 106 and a pad pattern 107 are formed on the buffer layer 108. Then, as shown in FIG. 4, a first conductive layer 112a, a light-emitting layer 114a, and a second conductive layer 116a are sequentially formed on the buffer layer 108 having the photonic crystal patterns 106 and the pad pattern 107 also formed thereon.

Figure 10:
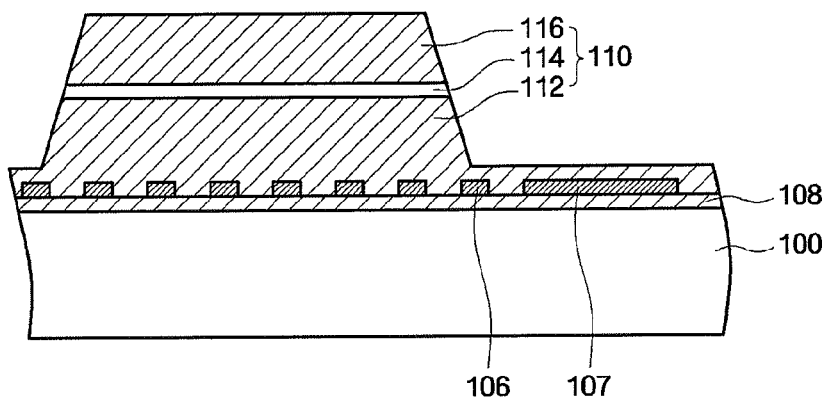
FIGS. 10 through 14 are views for explaining a second exemplary embodiment of processes included in a method of fabricating a light-emitting element according to aspects of the present invention.

Referring to FIG. 10, the second conductive layer 116a, the light-emitting layer 114a, and the first conductive layer 112a are patterned to form a light-emitting structure 110 which includes a first conductive pattern 112, a light-emitting pattern 114, and a second conductive pattern 116. As shown in the drawing, a lower portion of the light-emitting structure 110 may be wider than an upper portion thereof. Thus, the light-emitting structure 110 may have inclined sidewalls. In addition, the first conductive pattern 112 may be wider than the second conductive pattern 116 and the light-emitting pattern 114. Thus, the first conductive pattern 112 may have a protruding portion in a lateral direction. The pad pattern 107 may be disposed under the protruding portion of the first conductive pattern 112.

Figure 11:
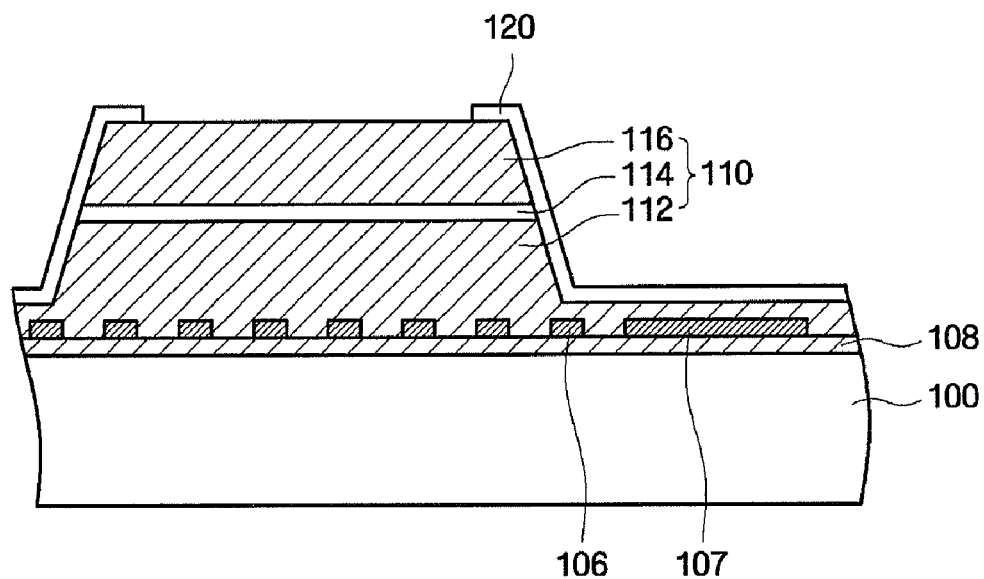

Referring to FIG. 11, an insulating layer 120 is formed on upper and side surfaces of the light-emitting structure 110. The insulating layer 120 may include a silicon oxide film, a silicon nitride film, an aluminum oxide ($Al_2O_3$) film, or an aluminum nitride (AlN) film. The insulating layer 120 may be formed by plasma enhanced chemical vapor deposition (PECVD), thermal oxidation, electron-beam evaporation, or the like.

Next, a portion of the insulating layer 120 is etched to expose a portion of an upper surface of the second conductive pattern 116.

Figure 12:
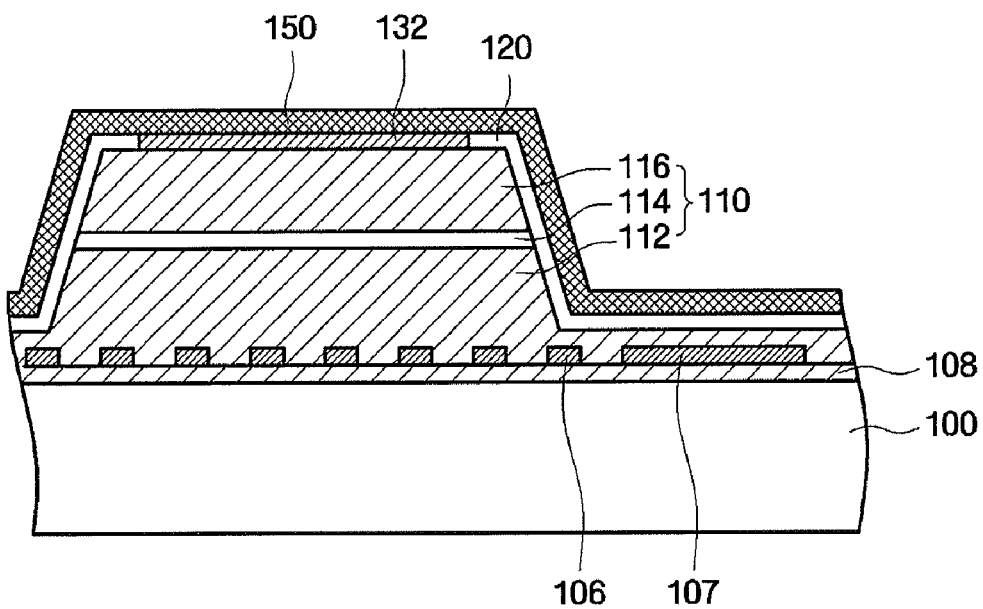

Referring to FIG. 12, a second ohmic layer 132 is formed on the exposed portion of the second conductive pattern 116. Then, a second electrode 150 is formed on the insulating layer 120 and the second ohmic layer 132. That is, the second electrode 150 is formed on the upper and side surfaces of the light-emitting structure 110 and an upper surface of the protruding portion of the first conductive pattern 112. The second electrode 150 may have at least a portion shaped like a bowl, which is shown inverted, that covers the light-emitting structure 110.

Although not shown in the drawing, the second electrode 150 may be formed only on the upper surface of the light-emitting structure 110.

The second electrode 150 may be made of a material having high reflectivity. For example, the second electrode 150 may be made of Ag or Al to reflect light generated by the light-emitting structure 110 so that the light can proceed toward the photonic crystal patterns 106.

Figure 13:
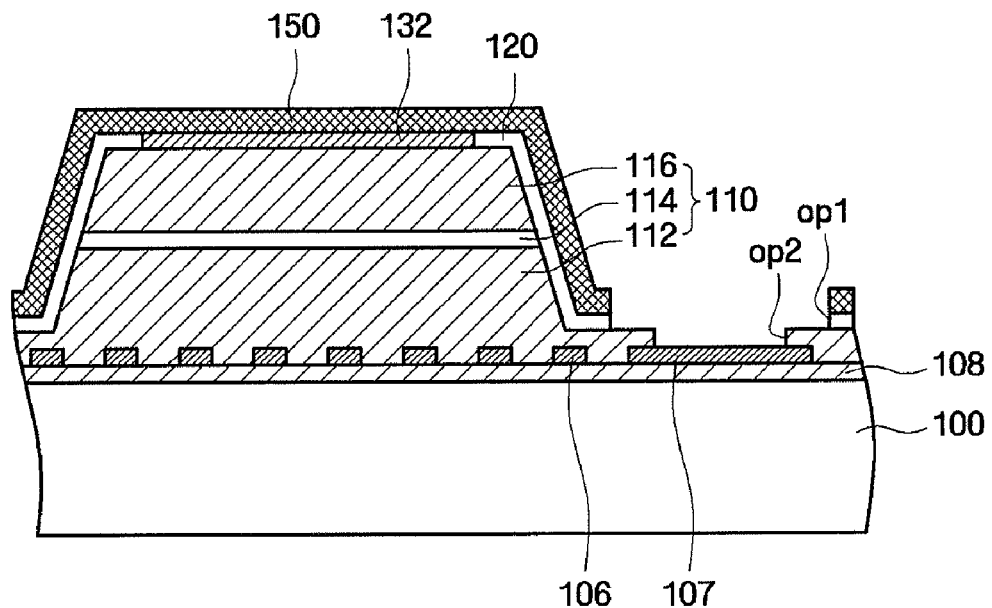

Referring to FIG. 13, a portion of the insulating layer 120 and a portion of the second electrode 150 are etched to form a first opening op1. The first opening op1 penetrates the insulating layer 120 disposed on the pad pattern 107.

Then, the protruding portion of the first conductive pattern 112 is partially etched to form a second opening op2. The second opening op2 penetrates part of the first conductive pattern 112 disposed on the pad pattern 107. Here, the second opening op2 may be narrower than the first opening op1. As described above, the portion of the insulating layer 120 and the portion of the second electrode 150 may be wet-etched to form the first opening op1, and part of the protruding portion of the first conductive pattern 112 may be dry-etched to form the second opening op2. Here, the wet-etching process and the dry-etching process may be performed by using the same mask (e.g., a photoresist pattern).

Figure 14:
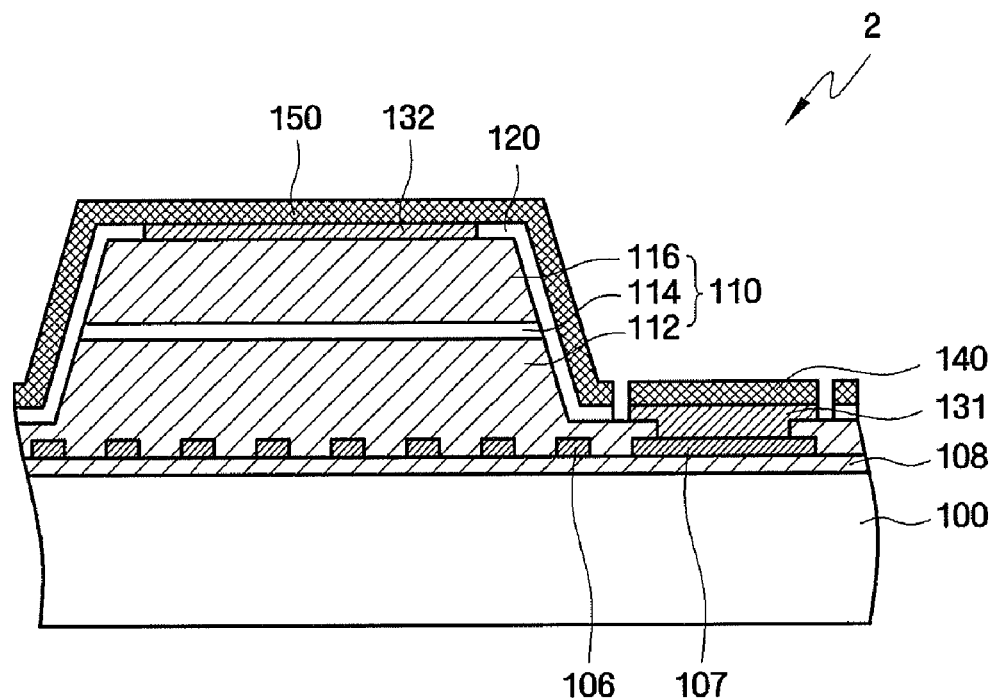

Referring to FIG. 14, a first ohmic layer 131 is formed to at least partially fill the first and second openings op1 and op2. Then, a first electrode 140 is formed on the first ohmic layer 131 to complete the light-emitting element 2 according to the second exemplary embodiment.

The light-emitting element 2 according to the second exemplary embodiment of the present invention will now be described in more detail.

The light-emitting element 2 according to the second exemplary embodiment is different from the light-emitting element 1 according to the first exemplary embodiment in that the second electrode 150 is formed not only on the upper surface of the light-emitting structure 110, but also on the sidewalls of the light-emitting structure 110. That is, the second electrode 150 may have at least a portion shaped like a bowl, which is shown inverted, that covers the light-emitting structure 110.

Even when the second electrode 150 is formed on the side surfaces of the light-emitting structure 110 (surrounds the light-emitting structure 110), it does not electrically connect (i.e., does not cause short-circuits between) the first conductive pattern 112 and the second conductive pattern 116 since the insulating layer 120 is formed between the second electrode 150 and the light-emitting structure 110. That is, the insulating layer 120 can prevent leakage current.

Since the light-emitting structure 110 has the inclined sidewalls, light emitted from the light-emitting structure 110 is reflected by the second electrode 150 surrounding the light-emitting structure 110 and then easily comes out of the light-emitting element 2 through the photonic crystal patterns 106. That is, the light-emitting structure 110 which has the inclined sidewalls and the second electrode 150 that is inclined along the profile of the light-emitting structure 110 and has high reflectivity can improve light extraction efficiency.

FIGS. 15 through 19 are views for explaining processes included in a third exemplary embodiment of a method of fabricating a light-emitting element 3 (see FIG. 19) according to aspects of the present invention. The light-emitting element 3 according to the third exemplary embodiment of the present invention may be of a vertical type.

Figure 15:
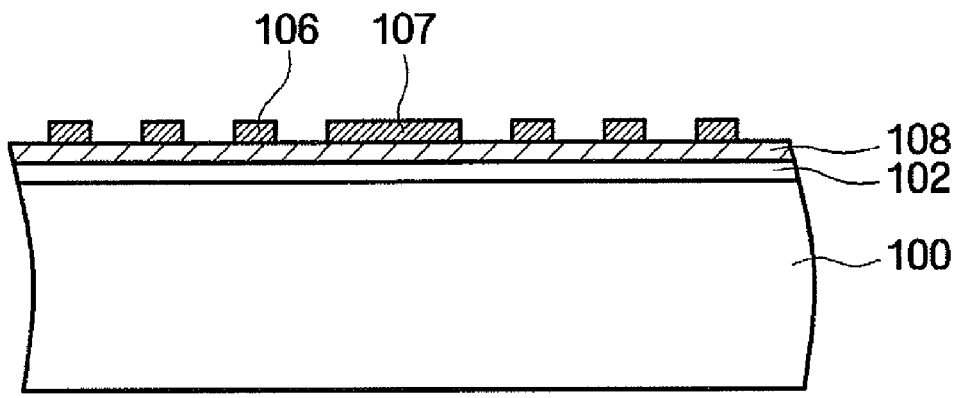
FIGS. 15 through 19 are views for explaining a third exemplary embodiment of processes included in a method of fabricating a light-emitting element according to aspects of the present invention.

Referring to FIG. 15, a sacrificial layer 102, a buffer layer 108, photonic crystal patterns 106, and a pad pattern 107 are sequentially formed on each of a plurality of substrates 100.

As will be described later, the sacrificial layer 102 is removed when each of the substrates 100 is removed by a laser lift-off (LLO) process. The sacrificial layer 102 may be, for example, a GaN layer.

The buffer layer 108 prevents the photonic crystal patterns 106 from being damaged during the LLO process and is used as a seed layer for sequentially forming (growing) a first conductive layer, a light-emitting layer and a second conductive layer. In addition, the buffer layer 108 is used to prevent a lattice mismatch between each of the substrates 100 and the first conductive layer, the light-emitting layer and the second conductive layer.

As described above, the photonic crystal patterns 106 improve light extraction efficiency and induce lateral growth. Thus, the photonic crystal patterns 106 are used to form the first conductive layer, the light-emitting layer, and the second conductive layer having low defect densities. The photonic crystal patterns 106 may include a plurality of repetitive (or periodic) patterns of photonic crystals. The photonic crystal patterns 106 may be arranged at predetermined intervals "a". When light generated by a light-emitting structure 110 (see FIG. 16) has a wavelength of λ, the interval "a" between every two adjacent ones of the photonic crystal patterns 106 may be λ/4. Here, the interval "a" between every two adjacent ones of the photonic crystal patterns 106 may be controlled based on λ/4, that is, may be substantially λ/4, with small variations tolerable.

As described above, the photonic crystal patterns 106 and the pad pattern 107 may be made of metal materials and physically connected to each other. In addition, the photonic crystal patterns 106 may be formed at substantially the same level as the pad pattern 107.

Figure 16:
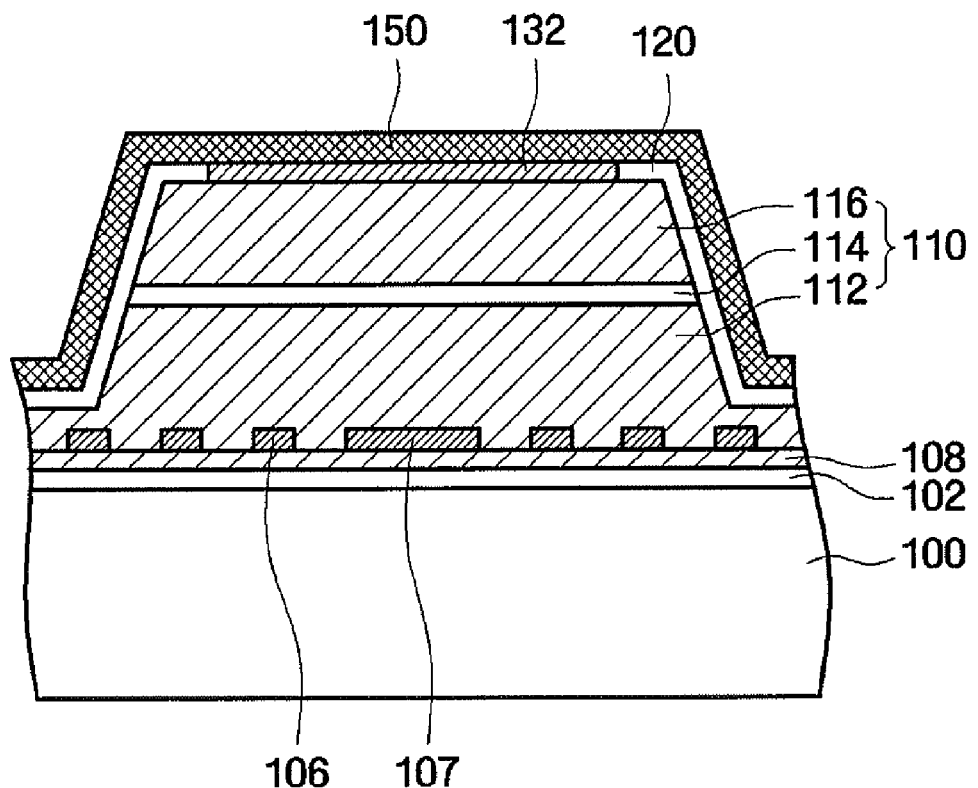

Referring to FIG. 16, the first conductive layer, the light-emitting layer, and the second conductive layer are sequentially grown on each of the substrates 100, which has the photonic crystal patterns 106 and the pad pattern 107 formed thereon.

Then, the second conductive layer, the light-emitting layer, and the first conductive layer are patterned to form the light-emitting structure 110, which includes a first conductive pattern 112, a light-emitting pattern 114, and a second conductive pattern 116. A lower portion of the light-emitting structure 110 may be wider than an upper portion thereof. Thus, the light-emitting structure 110 may have inclined sidewalls.

Next, an insulating layer 120 is formed on upper and side surfaces of the light-emitting structure 110.

Then, a portion of the insulating layer 120 is etched to expose a portion of an upper surface of the second conductive pattern 116.

A second ohmic layer 132 is formed on the exposed portion of the second conductive pattern 116.

A second electrode 150 is formed on the upper and side surfaces of the light-emitting structure 110. That is, the second electrode 150 is conformally formed on the second ohmic layer 132 and the insulating layer 120. Therefore, the second electrode 150 may have at least a portion shaped like a bowl, which is shown inverted, that covers the light-emitting structure 110.

Figure 17:
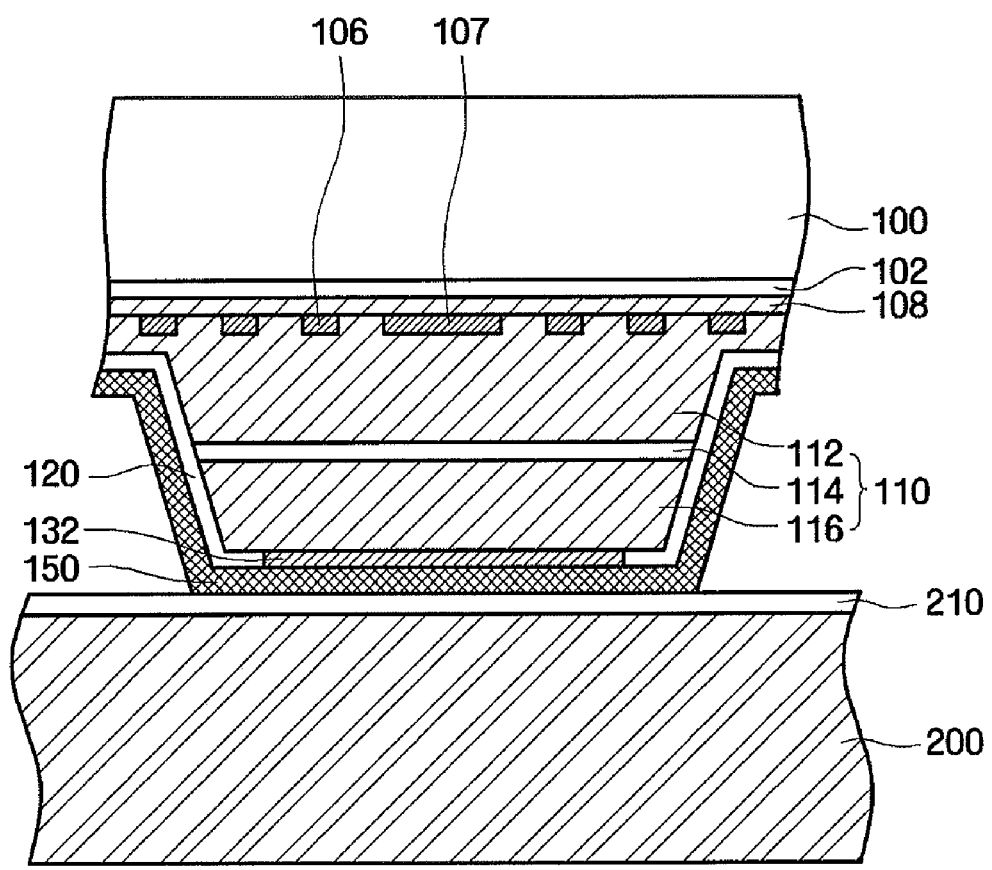

Referring to FIG. 17, each of the substrates 100 is bonded to a conductive substrate 200. Here, the second electrode 150 is disposed between the conductive substrate 200 and each of the substrates 100.

Specifically, the conductive substrate 200 may be made of one of Si, strained Si, Si—Al, silicon alloy, silicon-on-insulator (SOI), SiC, silicon germanium (SiGe), silicon germanium carbide (SiGeC), germanium (Ge), Ge alloy, gallium arsenide (GaAs), indium arsenide (InAs), III-V semiconductor, and II-VI semiconductor, as examples.

Preferably, in this embodiment, the substrates 100 or the conductive substrate 200, or both, may be substantially flat because it is hard to sufficiently bond the substrates 100 and 200 together when each of the substrates 100 or the conductive substrate 200 is other than flat, e.g., bent. As will be described later, since an intermediate material layer 210 is disposed between each of the substrates 100 and the conductive substrate 200, the intermediate material layer 210 (in particular, when the intermediate material layer 210 has a sufficient thickness) can compensate for the slight bending of each of the substrates 100 or the conductive substrate 200.

For example, the conductive substrate 200 may be adhesively bonded to the substrates 100. Preferably, the conductive substrate 200 and the substrates 100 are washed before bonding. It is desirable for bonding surfaces of the substrates 100 and 200 to be clean because various impurities (such as particles and dust) on the bonding surfaces of the substrates 200 and 100 can become sources of contamination. That is, when the conductive substrate 200 is bonded to the substrates 100, if the above impurities exist between the substrates 200 and 100, bonding energy can be reduced. As a result, the substrates 200 and 100 can be easily separated from each other.

Next, the intermediate material layer 210 is formed on the bonding surface of the conductive substrate 200 or the bonding surface of each of the substrates 100. In FIG. 17, the intermediate material layer 210 is formed on the bonding surface of the conductive substrate 200. Although not shown in the drawing, the intermediate material layer 210 may be conformally formed along the profile of the second electrode 150 of each of the substrates 100. Alternatively, after the intermediate material layer 210 is formed on the upper surface of the second electrode 150 of the light-emitting structure 110, each of the substrates 100 may be bonded to the conductive substrate 200.

The intermediate material layer 210 may be a conductive material, e.g., a metal layer. When the intermediate material layer 210 is a metal layer, the metal layer may include at least one of Au, Ag, Pt, Ni, Cu, Sn, Al, Pb, Cr, and Ti. That is, the metal layer may be a monolayer made of one of Au, Ag, Pt, Ni, Cu, Sn, Al, Pb, Cr and Ti, a stack of the same, or a combination of the same. For example, the metal layer may be an Au layer (a monolayer), an Au—Sn layer (a double layer), or a multi-layer having Au and Sn alternately stacked several times. The intermediate material layer 210 may be made of a material having lower reflectivity than that of the second electrode 150.

Although not shown in the drawing, a barrier layer may be formed between the second electrode 150 and the intermediate material layer 210. The barrier layer prevents the second electrode 150, which reflects light, from being damaged. The barrier layer may be a monolayer made of one of Pt, Ni, Cu, Al, Cr, Ti and W, a stack of the same, or a combination of the same. For example, the barrier layer may be a multi-layer having TiW and Pt alternately stacked several times.

Next, as shown in FIG. 17, the second electrode 150 formed on each of the substrates 100 is made to face the bonding surface of the conductive substrate 200, with the intermediate material layer 210 disposed between the two.

Then, the substrates 200 and 100 are heat-treated and thus bonded together. Alternatively, while the substrates 200 and 100 are heat-treated, they may be pressed against each other and thus bonded together.

When the intermediate material layer 210 is an Au layer, the substrates 200 and 100 may be pressed against each other at a temperature of approximately 200 to 450° C. The temperature used can be determined by one of ordinary skill in the art to which the present invention pertains, without undue experimentation.

Figure 18:
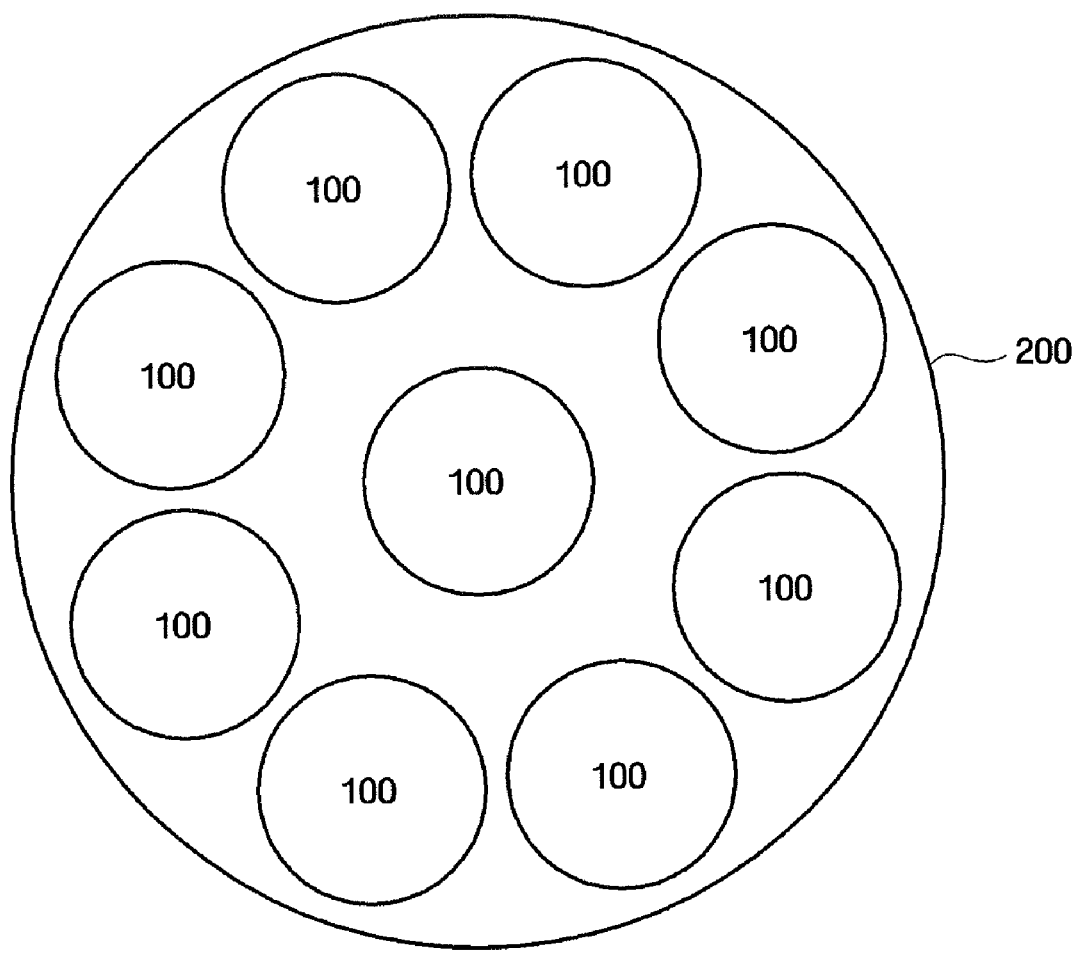

In order to increase throughput, the substrates 100 may be bonded to the one conductive substrate 200 as shown in FIG. 18. Specifically, the conductive substrate 200 is larger than each of the substrates 100, i.e., has a larger surface area sufficient for mounting a plurality of substrates 100. That is, the conductive substrate 200 completely hides each of the substrates 100 when put on top of each of the substrates 100. When the substrates 100 and 200 are circular, a diameter of the conductive substrate 200 may be greater than that of each of the substrates 100. For example, the diameter of the conductive substrate 200 may be about 6 inches (approximately 150 mm) or greater, and that of each of the substrates 100 may be less than about 6 inches. When the substrates 100 and 200 are square shaped, a diagonal length of the conductive substrate 200 may be greater than that of each of the substrates 100. Here, the second electrode 150 formed on each of the substrates 100 is made to face the bonding surface of the conductive substrate 200.

When throughput is not a concern, each of the substrates 100 may be substantially the same size as the conductive substrate 200. That is, one of the substrates 100 may be bonded to the conductive substrate 200.

Figure 19:
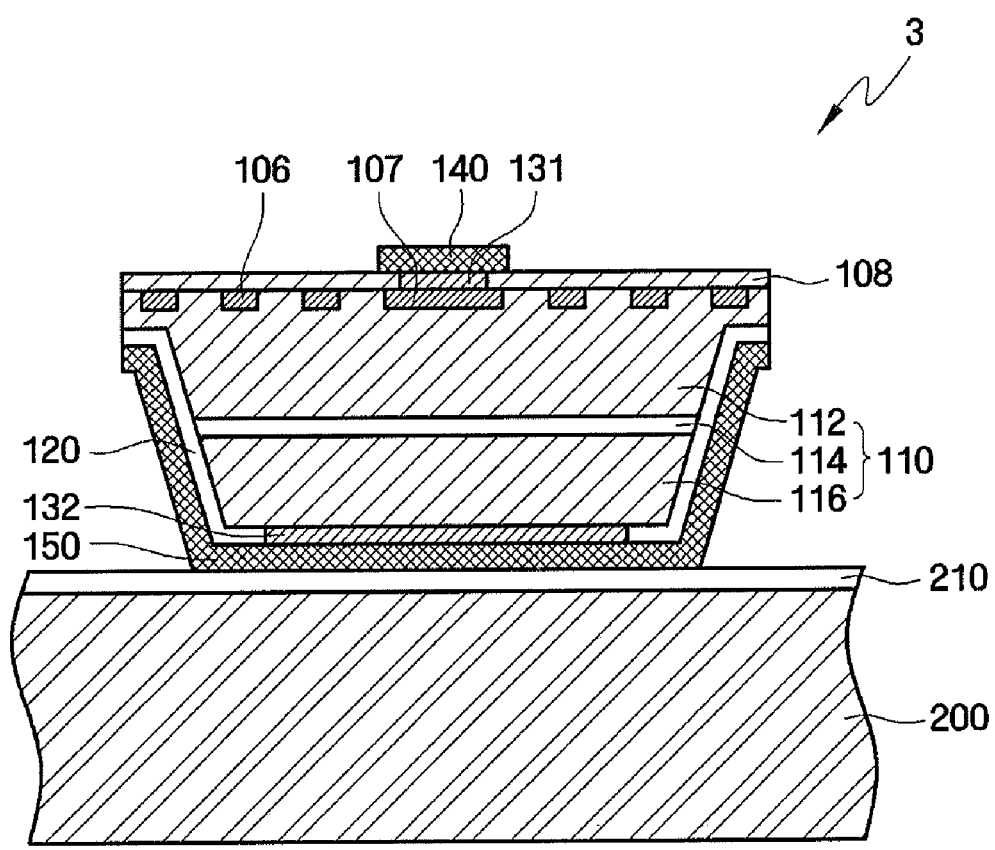

Referring to FIG. 19, each of the substrates 100 is removed by removing the sacrificial layer 102. Specifically, each of the substrates 100 may be removed by an LLO process or a chemical lift-off (CLO) process.

In the case of the LLO process, a laser beam is radiated from the side of each of the substrates 100. When the sacrificial layer 102 is removed by using a laser beam, each portion of each of the substrates 100 is sequentially removed, starting with a portion to which the laser beam is radiated.

In order to prevent the light-emitting element 3 from being damaged during the LLO process, a thickness of each of the substrates 100 may be reduced before the LLO process is performed. As described above, each portion of each of the substrates 100 may be sequentially removed starting with a portion to which a laser beam is radiated. Thus, the light-emitting structure 110 may be broken or damaged by physical force applied when each of the substrates 100 is removed. However, if the thickness of each of the substrates 100 is reduced in advance by, e.g., chemical mechanical polishing (CMP), the light-emitting structure 110 can be prevented from being damaged since the physical force applied when each of the substrates 100 is removed is reduced.

The buffer layer 108 prevents a first electrode 140 from being damaged during the LLO process.

Referring to FIG. 19, a portion of the buffer layer 108, which is exposed after each of the substrates 100 is removed, is etched to expose the pad pattern 107. Here, the portion of the buffer layer 108 is etched to expose at least part of the pad pattern 107.

Next, a first ohmic layer 131 is formed on the exposed portion of the pad pattern 107.

Then, the first electrode 140 is formed on the first ohmic layer 131 to complete the light-emitting element 3 according to the third exemplary embodiment.

The light-emitting element 3 according to the third exemplary embodiment includes the second electrode 150, the light-emitting structure 110, the photonic crystal patterns 106, and the pad pattern 107. The second electrode 150 is formed on the conductive substrate 200 and is bowl-shaped. The light-emitting structure 110 includes the second conductive pattern 116, the light-emitting pattern 114, and the first conductive pattern 112 which are sequentially formed on the second electrode 150. The photonic crystal patterns 106 and the pad pattern 107 are formed on the first conductive pattern 112. As described above, the photonic crystal patterns 106 and the pad pattern 107 may be made of metal materials and physically connected to each other. In addition, the photonic crystal patterns 106 may be formed at substantially the same level as the pad pattern 107.

The buffer layer 108 is formed on the first conductive pattern 112 having the photonic crystal patterns 106 and the pad pattern 107 and exposes at least part of the pad pattern 107. The first ohmic layer 131 is formed on the exposed portion of the pad pattern 107, and the first electrode 140 is formed on the first ohmic layer 131. That is, the first electrode 140 is electrically connected to the first conductive pattern 112 by the first ohmic layer 131.

The buffer layer 108 may be more resistant than the first conductive pattern 112 because the first conductive pattern 112 may be doped with dopants of the first conductivity type while the buffer layer 108 may not be. Therefore, the first electrode 140 may be electrically connected to the pad pattern 107 by the first ohmic layer 131 such that power applied to the first electrode 140 can be delivered to the pad pattern 107 and the first conductive pattern 112 without a significant drop in the power level.

Figure 20:
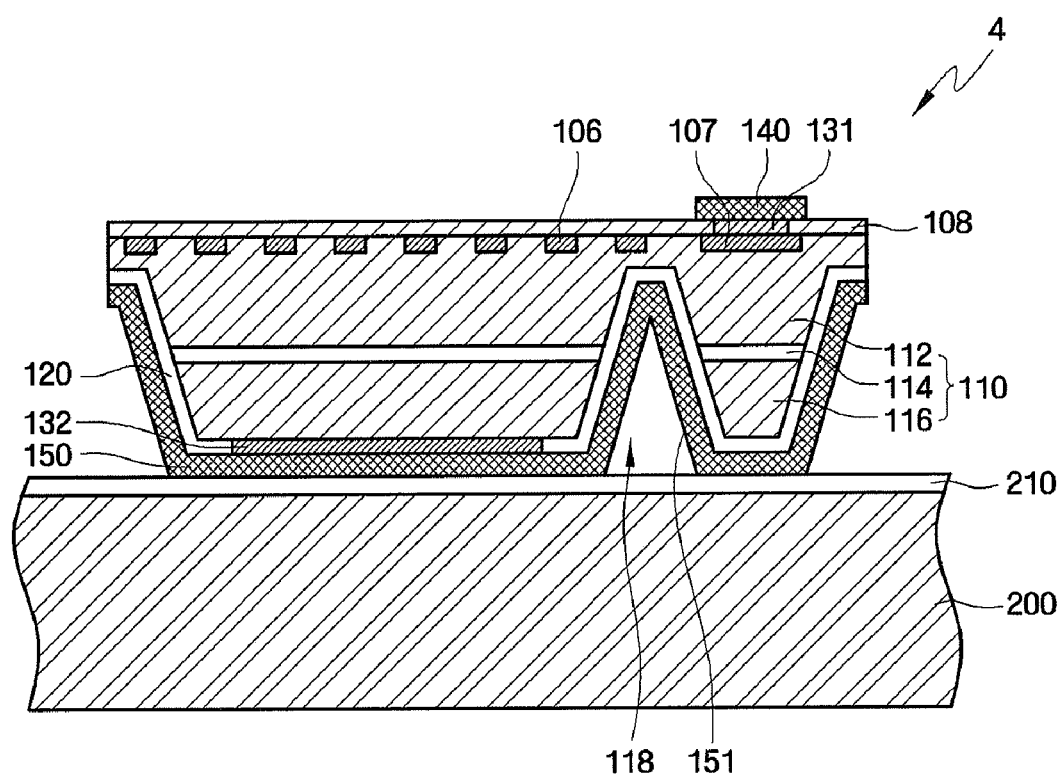
FIG. 20 is a view for explaining a fourth exemplary embodiment of a light-emitting element according to aspects of the present invention.

FIG. 20 is a view for explaining a fourth exemplary embodiment of a light-emitting element 4 according to aspects of the present invention.

Referring to FIG. 20, the light-emitting element 4 according to the fourth exemplary embodiment is different from the light-emitting element 3 according to the third exemplary embodiment in that a protrusion 151 is formed on a bowl-shaped second electrode 150 and that the protrusion 151 creates a groove 118 in a light-emitting structure 110 formed in the second electrode 150.

The light-emitting structure 110 may be divided into a first side (e.g., the left side of the drawing) and a second side (e.g., the right side of the drawing) by the protrusion 151 or the groove 118. A pad pattern 107 may be formed on the second side of the light-emitting structure 110, and photonic crystal patterns 106 may be formed on the first side of the light-emitting structure 110.

Even in this configuration, the pad pattern 107 is physically connected to the photonic crystal patterns 106, and power applied to the first electrode 140 is delivered to the photonic crystal patterns 106 via the pad pattern 107. The flow of electric current between the first electrode 140 and the second electrode 150 can be adjusted appropriately, thereby improving light emission efficiency.

Hereinafter, a light-emitting device fabricated by using one of the light-emitting elements 1 through 4 will be described in detail. For simplicity, a light-emitting device using the light-emitting element 1 according to the first exemplary embodiment is shown in the drawings. However, the scope of the present invention is not limited thereto. It will be apparent to those of ordinary skill in the art to which the present invention pertains, having the benefit of this disclosure, that one can implement a light-emitting device similar to the light-emitting device using the light-emitting element 1 by using any one of the light-emitting elements 2 through 4.

Figure 21A:
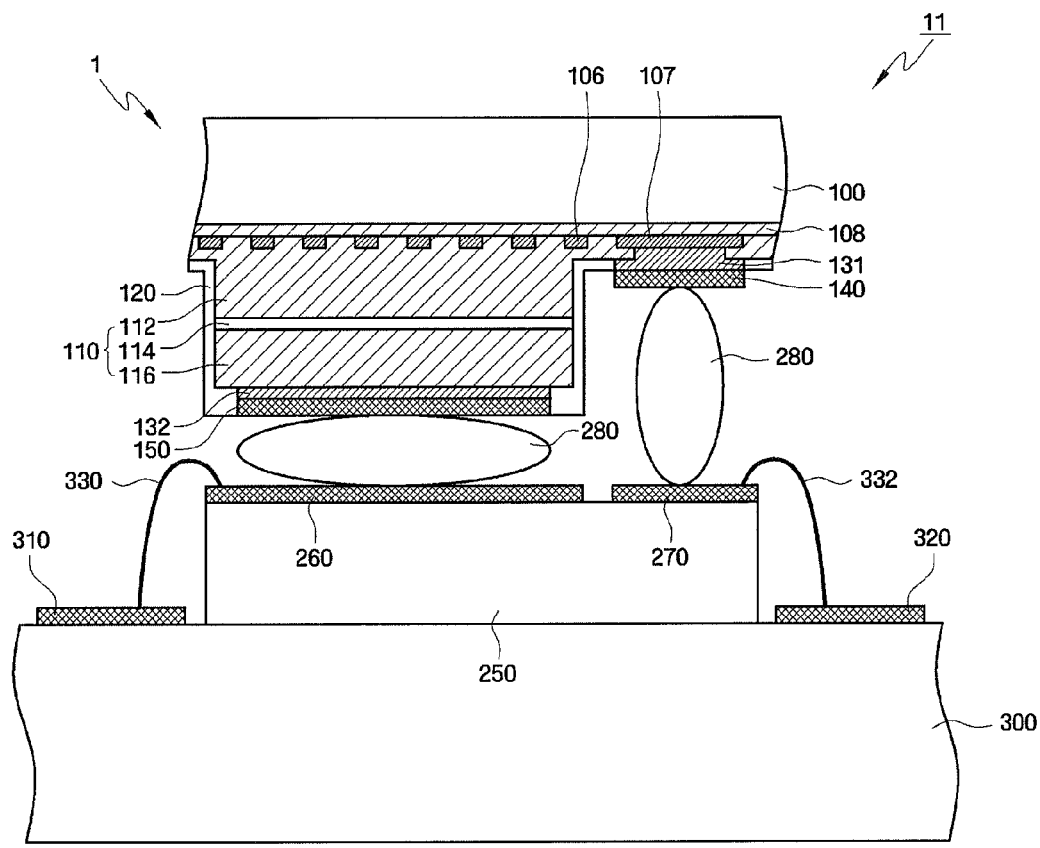
FIG. 21A is a view for explaining a first exemplary embodiment of a light-emitting device according to aspects of the present invention.

FIG. 21A is a view for explaining a first exemplary embodiment of a light-emitting device 11 according to aspects of the present invention.

Referring to FIG. 21A, the light-emitting device 11 according to the first exemplary embodiment includes a circuit board 300 and the light-emitting element 1 according to the first exemplary embodiment, which is disposed on the circuit board 300. The light-emitting element 1 may be connected to the circuit board 300 by a submount 250.

The circuit board 300 includes a first conductive region 310 and a second conductive region 320 which are electrically insulated from each other. The first conductive region 310 and the second conductive region 320 are disposed on a surface of the circuit board 300.

The submount 250 includes a third conductive region 260 and a fourth conductive region 270 that are electrically insulated from each other. The third conductive region 260 and the fourth conductive region 270 are disposed on a surface of the submount 250.

The second electrode 150 of the light-emitting element 1 may be connected to the third conductive region 260 of the submount 250 by one of conductive solders 280, and the third conductive region 260 may be connected to the first conductive region 310 by a wire 330. The first electrode 140 of the light-emitting element 1 may be connected to the fourth conductive region 270 of the submount 250 by the other one of the conductive solders 280, and the fourth conductive region 270 may be connected to the second conductive region 320 by a wire 332. However, it will be apparent to those of ordinary skill in the art to which the present invention pertains, having the benefit of this disclosure, that one can connect the above components in different ways other than the way shown in FIG. 21A.

Figure 21B:
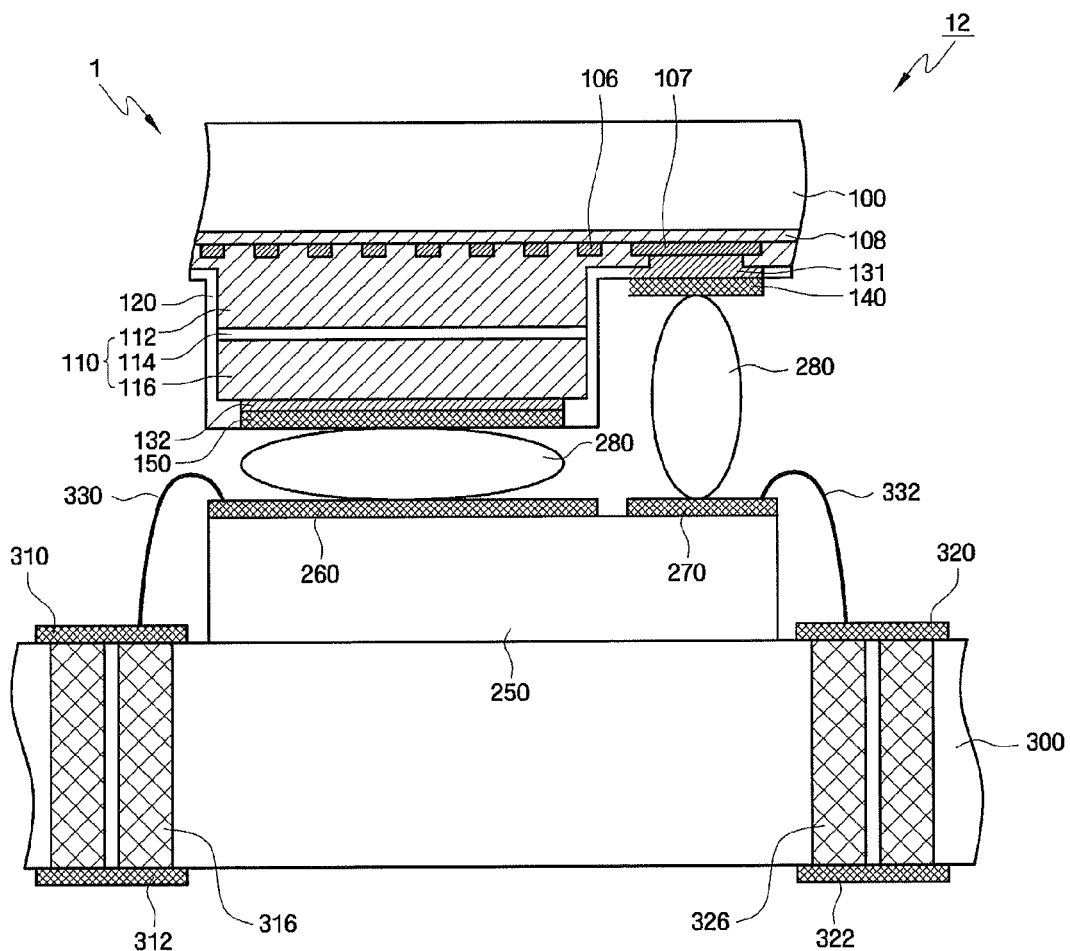
FIG. 21B is a view for explaining a second exemplary embodiment of a light-emitting device according to aspects of the present invention.

FIG. 21B is a view for explaining a second exemplary embodiment of a light-emitting device 12 according to aspects of the present invention. Referring to FIG. 21B, the light-emitting device 12 according to the second exemplary embodiment is different from the light-emitting device 11 according to the first exemplary embodiment in that a circuit substrate 300 includes first and second through vias 316 and 326.

Specifically, a first conductive region 310 and a second conductive region 320, which are electrically insulated from each other, are formed on a surface of the circuit board 300, and a fifth conductive region 312 and a sixth conductive region 322, which are electrically insulated from each other, are formed on the other surface of the circuit board 300. The first conductive region 310 is connected to the fifth conductive region 312 by the first through vias 316, and the second conductive region 320 is connected to the sixth conductive region 322 by the second through vias 326.

Although not shown in the drawing, the second electrode 150 of the light-emitting element 1 according to the first exemplary embodiment is connected to the first conductive region 310 of the circuit board 300 by one of conductive solders 280. The first electrode 140 of the light-emitting element 1 is connected to the second conductive region 320 of the circuit board 300 by the other one of the conductive solders 280. The first conductive region 310 may be connected to the fifth conductive region 312 by the first through vias 316, and the second conductive region 320 may be connected to the sixth conductive region 322 by the second through vias 326.

Figure 21C:
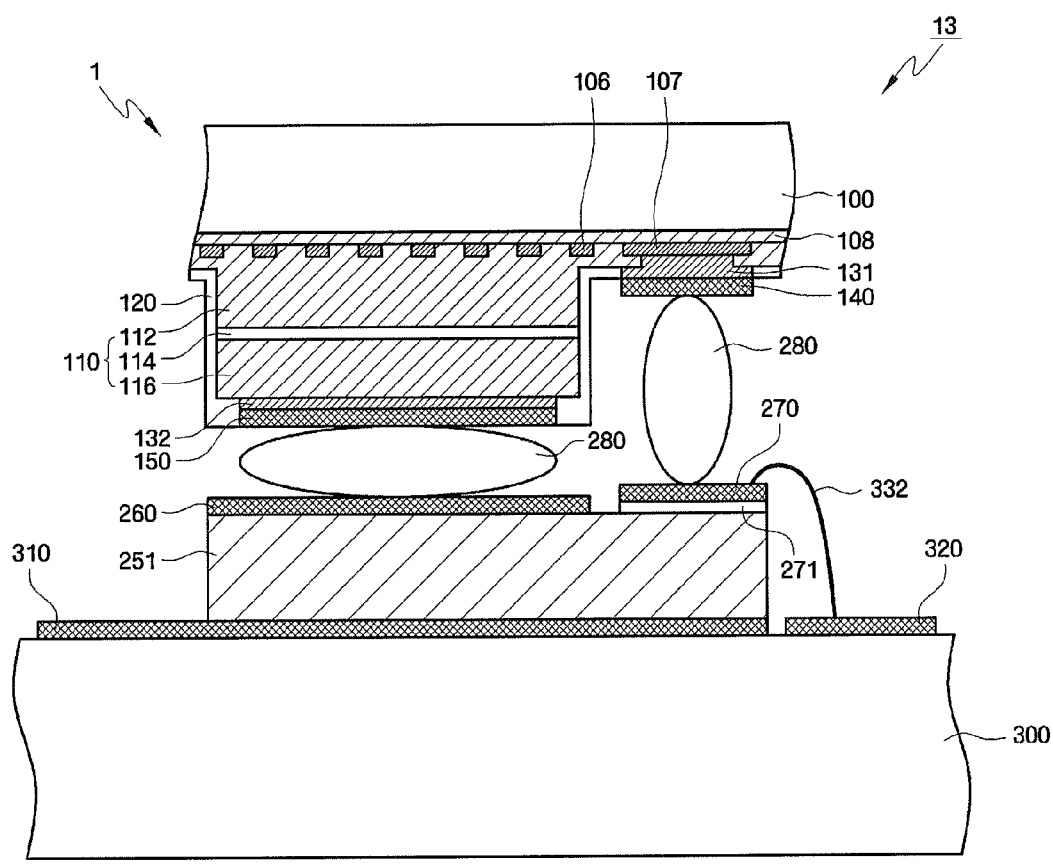
FIG. 21C is a view for explaining a third exemplary embodiment of a light-emitting device according to aspects of the present invention.

FIG. 21C is a view for explaining a third exemplary embodiment of a light-emitting device 13 according to aspects of the present invention. Referring to FIG. 21C, the light-emitting device 13 according to the third exemplary embodiment is different from the light-emitting device 11 according to the first exemplary embodiment in that a submount 251 is a conductive substrate.

Therefore, in order to prevent short circuits between a third conductive region 260 and the fourth conductive region 270, an insulating film 271 is interposed between a fourth conductive region 270 and the submount 251.

Since the submount 251 is a conductive substrate, a first conductive region 310 may be electrically connected to the third conductive region 260 by the conductive substrate without requiring a wire. On the other hand, a second conductive region 320 is connected to the fourth conductive region 270 by a wire 332.

Figure 22:
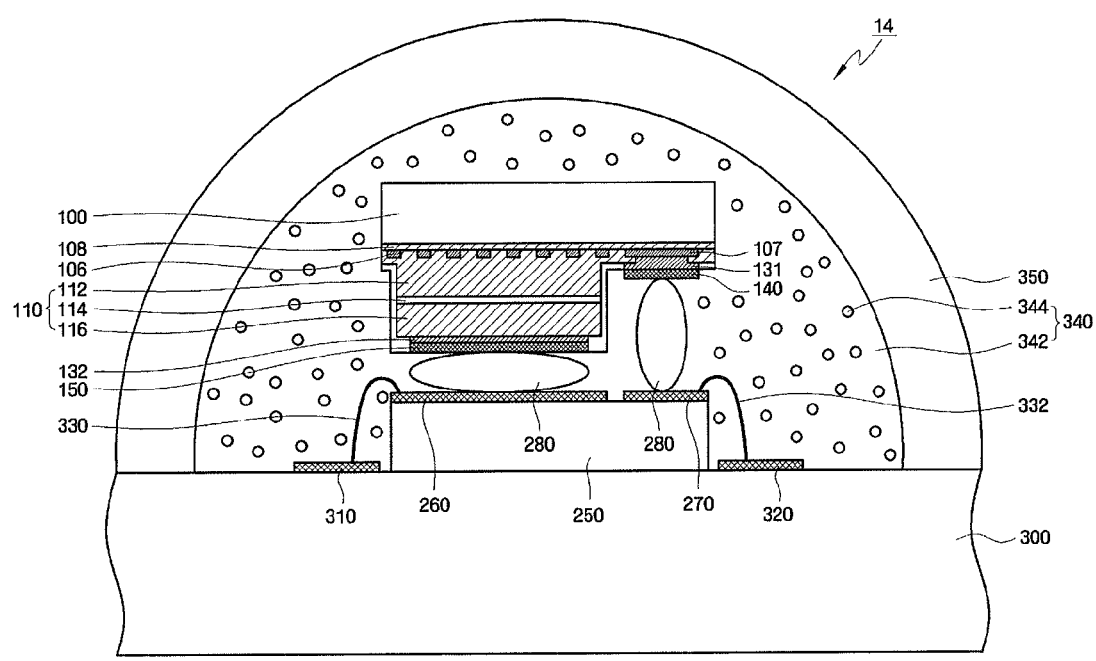
FIG. 22 is a view for explaining a fourth exemplary embodiment of a light-emitting device according to aspects of the present invention.

FIG. 22 is a view for explaining a fourth exemplary embodiment of a light-emitting device 14 according to aspects of the present invention. Referring to FIG. 22, the light-emitting device 14 according to the fourth exemplary embodiment is different from the light-emitting device 11 according to the first exemplary embodiment in that it includes a phosphor layer 340 surrounding the light-emitting element 1 according to the first exemplary embodiment and second transparent resin 350 which surrounds the phosphor layer 340.

The phosphor layer 340 may be a mixture of first transparent resin 342 and phosphors 344. The phosphors 344 dispersed within the phosphor layer 340 absorb light emitted from the light-emitting element 1 and convert the wavelength of the light. Thus, as the phosphors 344 are dispersed more evenly, the light-emitting properties of the light-emitting device 14 can be improved. When the phosphors 344 are dispersed more evenly, they can better convert the wavelength of light and produce a better color mixture. As shown in the drawing, the phosphor layer 340 may be formed higher than a wire 332 in order to protect the wire 332, since the wire is surrounded by the phosphor layer 340.

For example, the light-emitting device 14 may include the phosphor layer 340 formed to produce the color white. When the light-emitting element 1 emits light having a blue wavelength, the phosphors 344 may include yellow phosphors. In order to increase a color-rending index (CRI), the phosphors 344 may also include red phosphors. Alternatively, when the light-emitting element 1 emits light having a UV wavelength, the phosphors 344 may include all of red, green, and blue phosphors.

The first transparent resin 342 may be any material that can disperse the phosphors 344 in a stable manner. For example, the first transparent resin 342 may be epoxy resin, silicon resin, hard silicon resin, denatured silicon resin, urethane resin, oxetane resin, acrylic resin, polycarbonate resin, or polyimide resin.

The phosphors 344 may be any material that can absorb light from the light-emitting structure 110 and convert the wavelength of the absorbed light. For example, the phosphors 344 may be at least one of nitride-based or oxynitride-based phosphors activated mainly by a lanthanoid element such as europium (Eu) or cerium (Ce); alkaline earth halogen apatite phosphors activated mainly by a lanthanoid element such as Eu or a transition metal element such as manganese (Mn); alkaline earth metal halogen borate phosphors; alkaline earth metal aluminate phosphors; alkaline earth silicate phosphors; alkaline earth sulfide phosphors; alkaline earth thiogallate phosphors; alkaline earth silicon nitride phosphors; germanate phosphors; rare earth aluminate phosphors activated mainly by a lanthanoid element such as Ce; rare earth silicate phosphors; and organic or organic complex phosphors activated mainly by a lanthanoid element such as Eu. Specifically, phosphors listed below may be used. However, the phosphors 344 are not limited to the following phosphors.

Examples of nitride-based phosphors activated mainly by a lanthanoid element such as Eu or Ce include $M_2Si_5N_8$:Eu (M is at least one of Sr, Ca, Ba, Mg and Zn), $MSi_7N_{10}$:Eu, $M_{1.8}Si_5O_{0.2}N_8$:Eu, and $M_{0.9}Si_7O_{0.1}N_{10}$:Eu (M is at least one of Sr, Ca, Ba, Mg and Zn).

Examples of oxynitride-based phosphors activated mainly by a lanthanoid element such as Eu or Ce include $MSi_2O_2N_2$:Eu (M is at least one of Sr, Ca, Ba, Mg and Zn).

Examples of alkaline earth halogen apatite phosphors activated mainly by a lanthanoid element such as Eu or a transition metal element such as Mn include $M_5(PO_4)_3X:R$ (M is at least one of Sr, Ca, Ba, Mg and Zn, X is at least one of F, Cl, Br and I, and R is at least one of Eu and Mn).

Examples of alkaline earth metal halogen borate phosphors include $M_2B_5O_9X:R$ (M is at least one of Sr, Ca, Ba, Mg and Zn, X is at least one of F, Cl, Br and I, and R is at least one of Eu and Mn).

Examples of alkaline earth metal aluminate phosphors include $SrAl_2O_4:R$, $Sr_4Al_{14}O_{25}:R$, $CaAl_2O_4:R$, $BaMg_2Al_{16}O_{27}:R$, $BaMg_2Al_{16}O_{12}:R$, and $BaMgAl_{10}O_{17}:R$ (R is at least one of Eu and Mn).

Examples of alkaline earth sulfide phosphors include $La_2O_2S:Eu$, $Y_2O_2S:Eu$, and $Gd_2O_2S:Eu$.

Examples of rare earth aluminate phosphors activated mainly by a lanthanoid element such as Ce include YAG phosphors represented by compositional formulas such as $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$, and $(Y, Gd)_3(Al, Ga)_5O_{12}$. Other examples include phosphors such as $Tb_3Al_5O_{12}:Ce$ and $Lu_3Al_5O_{12}:Ce$ in which part or all of Y has been replaced by Tb, Lu, or the like.

Rare earth silicate phosphors contain silicate, and major examples of the rare earth silicate phosphors include $(SrBa)_2SiO_4:Eu$.

Examples of other phosphors include $ZnS:Eu$, $Zn_2GeO_4:Mn$, and $MGa_2S_4:Eu$ (M is at least one of Sr, Ca, Ba, Mg and Zn, and X is at least one of F, Cl, Br, and I).

The above phosphors may also include at least one of Tb, Cu, Ag, Au, Cr, Nd, Dy, Co, Ni and Ti, instead of or in addition to Eu. Furthermore, other phosphors that offer similar performance and effects to the phosphors listed above can also be used.

The second transparent resin 350 is lens-shaped and diffuses light emitted from the light-emitting element 1. The curvature and flatness of the second transparent resin 350 may be adjusted to control the light diffusion/extraction properties of the second transparent resin 350. The second transparent resin 350 surrounds the phosphor layer 340 to protect the phosphor layer 340. That is, the second transparent resin 350 surrounds the phosphor layer 340 because the properties of the phosphor layer 340 may deteriorate when contacting, for example, moisture.

The second transparent resin 350 may be any material through which light can pass. For example, the second transparent resin 350 may be epoxy resin, silicon resin, hard silicon resin, denatured silicon resin, urethane resin, oxetane resin, acrylic resin, polycarbonate resin, or polyimide resin.

Figure 23:
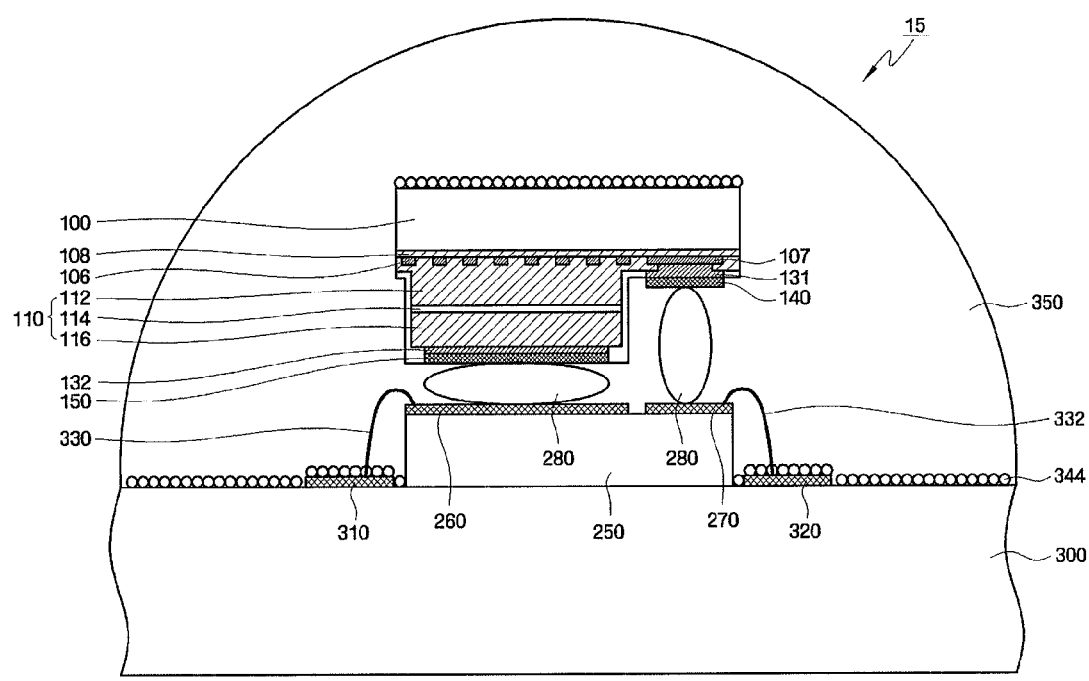
FIG. 23 is a view for explaining a fifth exemplary embodiment of a light-emitting device according to aspects of the present invention.

FIG. 23 is a view for explaining a fifth exemplary embodiment of a light-emitting device 15 according to aspects of the present invention. Referring to FIG. 23, phosphors 344 are formed along the profile of the light-emitting element 1 according to the first exemplary embodiment and the profile of a circuit board 300. Here, the phosphors 344 may be coated on the light-emitting element 1 and the circuit board 300 without requiring first transparent resin (indicated by reference numeral 342 in FIG. 22).

If the phosphors 344 are coated on the light-emitting element 1 and the circuit board 300 without requiring the first transparent resin, the light-emitting element 1 is surrounded by a monolayer 350 of transparent resin.

Figure 24:
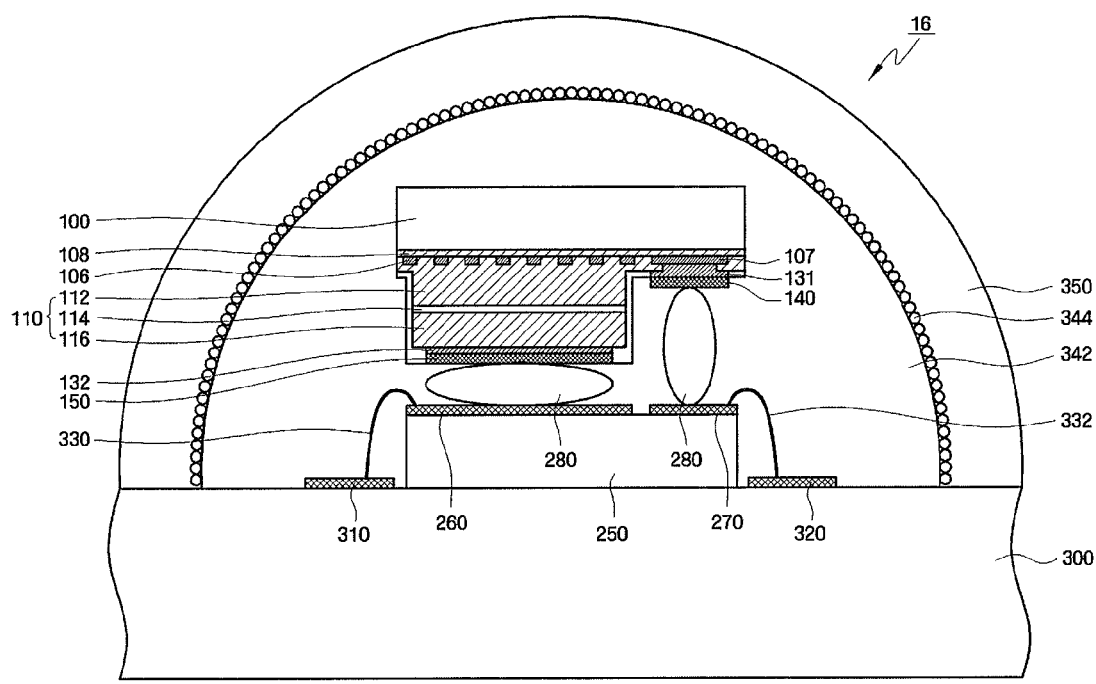
FIG. 24 is a view for explaining a sixth exemplary embodiment of a light-emitting device according to aspects of the present invention.

FIG. 24 is a view for explaining a sixth exemplary embodiment of a light-emitting device 16 according to aspects of the present invention. Referring to FIG. 16, the light-emitting device 16 according to the sixth exemplary embodiment is different from the light-emitting device 13 according to the third exemplary embodiment in that it includes first transparent resin 342, which surrounds the light-emitting element 1 according to the first exemplary embodiment, phosphors 344 which are formed on the first transparent resin 342, and second transparent resin 350 which is formed on the phosphors 344. That is, since the first transparent resin 342 and the phosphors 344 are coated separately without being mixed with each other, the phosphors 344 may be formed thinly and conformally along a surface of the first transparent resin 342.

Figure 25:
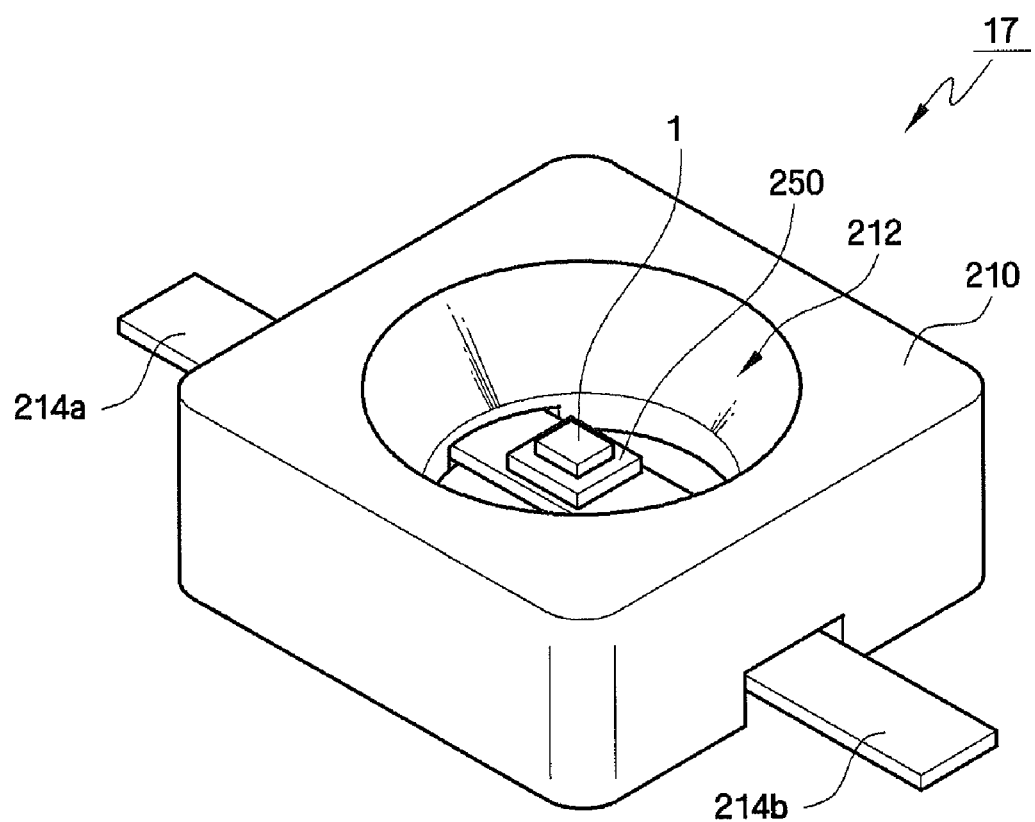
FIG. 25 is a view for explaining a seventh exemplary embodiment of a light-emitting device according to aspects of the present invention.

FIG. 25 is a view for explaining a seventh exemplary embodiment of a light-emitting device 17 according to aspects of the present invention. The light-emitting device 17 shown in FIG. 25 is a top view-type light-emitting package. However, the present invention is not limited thereto.

Referring to FIG. 25, a submount 250 on which the light-emitting element 1 according to the first exemplary embodiment is mounted is disposed on a package body 210. Specifically, a opening 212 is formed in the package body 210, and the submount 250 having the light-emitting element 1 mounted thereon is disposed in the opening 212. The opening 212 may have inclined sidewalls. Thus, light emitted from the light-emitting element 1 may be reflected by the sidewalls and then proceed forward. The size of the opening 212 may be determined in consideration of the degree to which light generated by the light-emitting element 1 is reflected by the sidewalls of the opening 212, the angle at which the light is reflected by the sidewalls of the opening 212, the type of transparent resin that fills the opening 212, the type of phosphors, and the like. The submount 250 is preferably placed in the center of the opening 212 since chromatic non-uniformity can be easily prevented when the light-emitting element 1 is equidistant from the sidewalls of the opening 212.

The package body 210 may be made of an exceptionally lightfast organic material, such as silicon resin, epoxy resin, acrylic resin, urea resin, fluorine resin or imide resin, or may be made of an exceptionally lightfast inorganic material such as glass or silica gel. In addition, thermosetting resin may be used in order to prevent the package body 210 from melting due to heat while the light-emitting device 17 is being fabricated. Various fillers, such as aluminum nitride, aluminum oxide, and compounds of the same, may be added to resin in order to relieve thermal stress of the resin. The package body 210 may also be made of a material other than resin. For example, part (e.g., the sidewalls) or all of the package body 210 may be made of a metal material or a ceramic material. When all of the package body 210 is made of a metal material, heat generated by the light-emitting element 1 can be easily dissipated out of the package body 210.

Leads 214a and 214b are formed in the package body 210 and are electrically connected to the light-emitting element 1. The light-emitting element 1 may be electrically connected to the submount 250, and the submount 250 may be connected to the leads 214a and 214b by vias. The leads 214a and 214b may be made of a highly thermally conductive material since heat generated by the light-emitting element 1 can be dissipated directly out of the package body 210 through the leads 214 and 214b when the leads 214a and 214b are made of a highly thermally conductive material.

Although not shown in the drawing, at least part of the opening 212 may be filled with a transparent resin layer. In addition, phosphors may be formed on the transparent resin layer. Alternatively, the transparent resin layer may be mixed with the phosphors.

For example, phosphors may be used as follows in order to produce the color white. When the light-emitting element 1 emits light having a blue wavelength, phosphors may include yellow phosphors. In order to increase the CRI, the phosphors may also include red phosphors. Alternatively, when the light-emitting element 1 emits light having a UV wavelength, the phosphors may include all of red, green, and blue phosphors.

Figure 26:
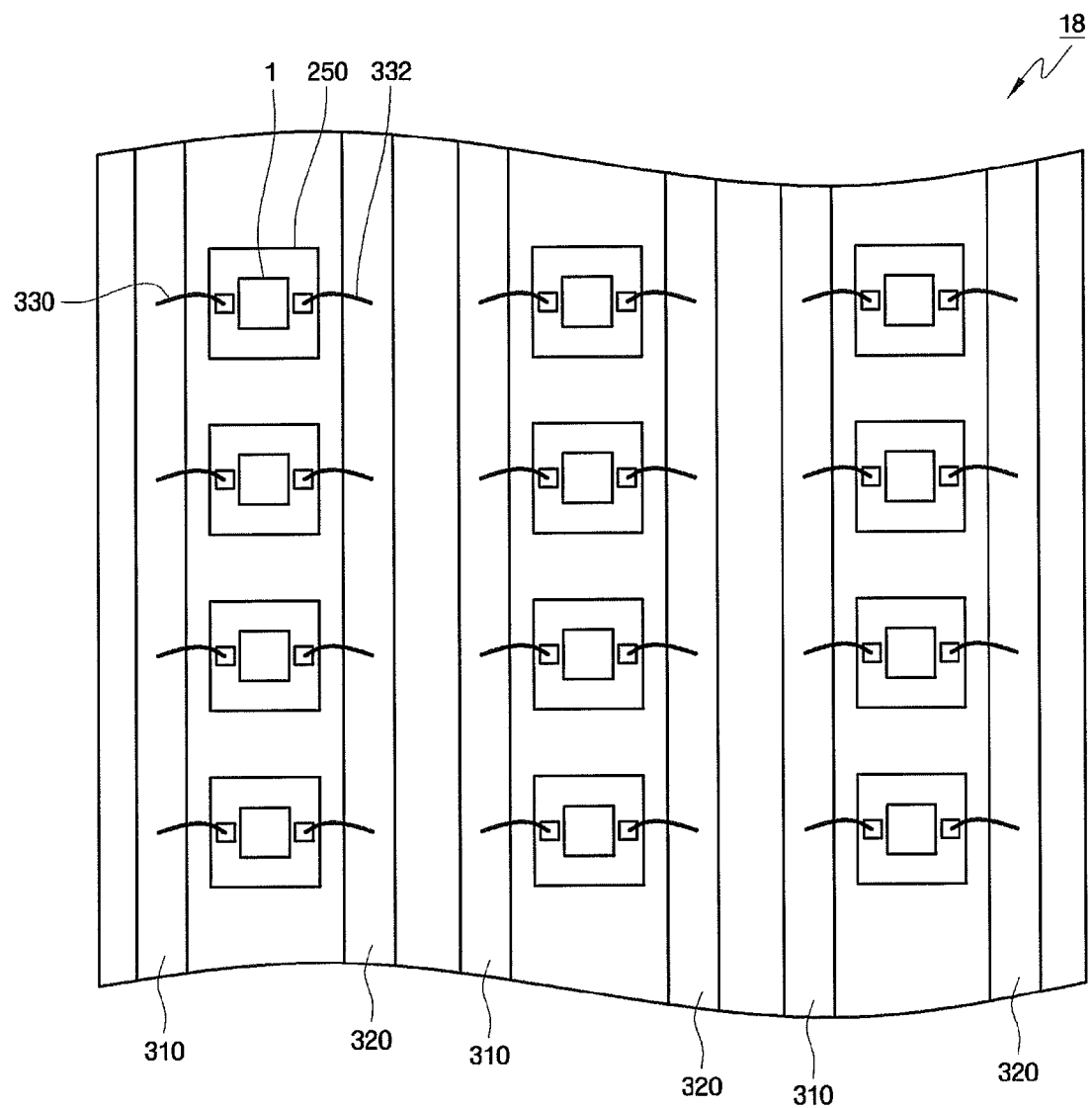
FIGS. 26 through 28 are views for explaining an eighth exemplary embodiment of a light-emitting device according to aspects of the present invention.
Figure 27:
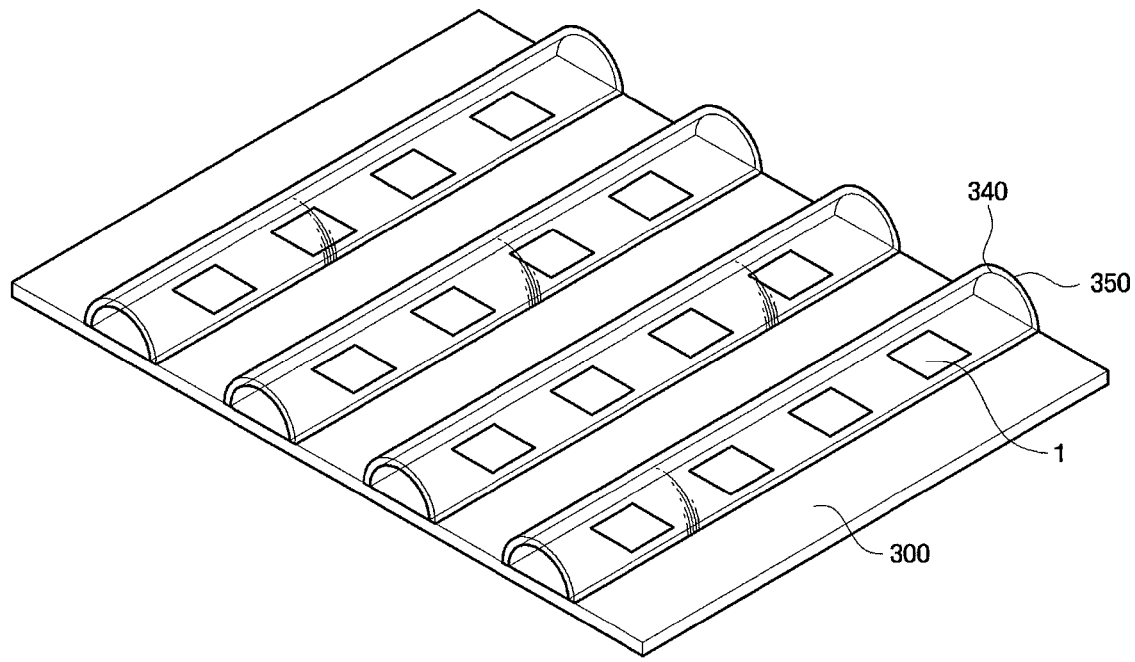
Figure 28:
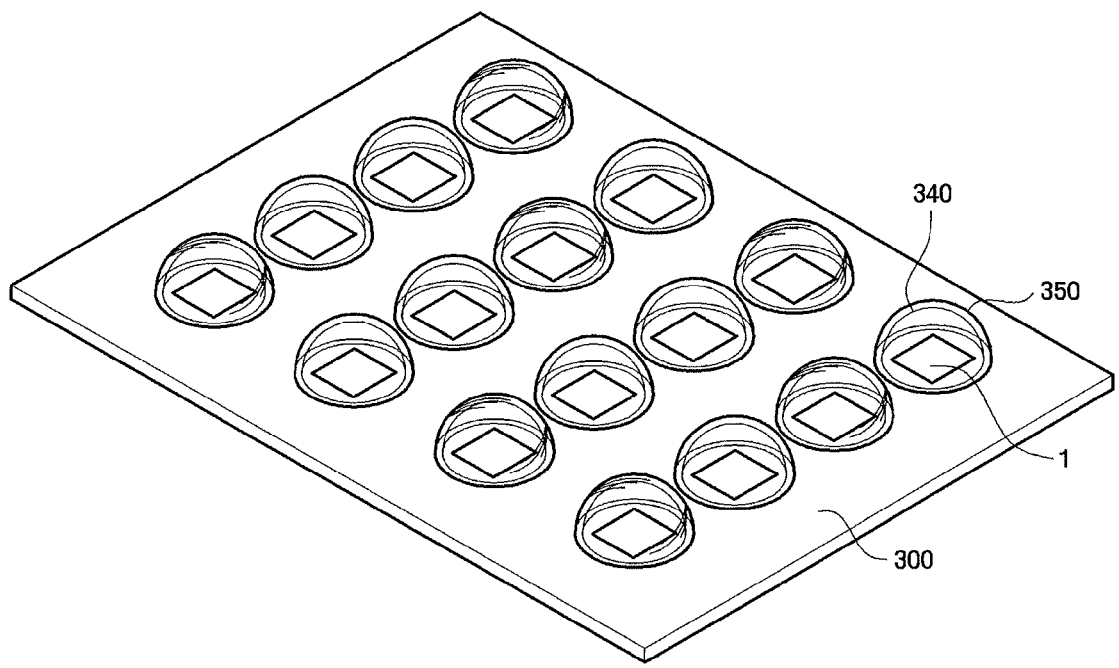

FIGS. 26 through 28 are views for explaining an eighth exemplary embodiment of a light-emitting device 18 according to aspects of the present invention. Specifically, FIGS. 26 through 28 are views for explaining an array of the light-emitting elements 1 according to the first exemplary embodiment, which are disposed on a circuit board 300. In particular, FIGS. 27 and 28 show phosphor layers 340 and second transparent resin 350 formed on the array of the light-emitting elements 1.

Referring to FIG. 26, a first conductive region 310 and a second conductive region 320 are formed on the circuit board 300 and extend in a direction to be parallel to each other. The light-emitting elements 1 are arranged in a line in the direction in which the first conductive region 310 and the second conductive region 320 extend. As described above, the second electrode 150 of each of the light-emitting elements 1 may be connected to the first conductive region 310 by a submount 250 and a wire 330, and the first electrode 140 of each of the light-emitting elements 1 may be connected to the second conductive region 320 by the submount 250 and a wire 332.

When appropriate biases are applied to the first conductive region 310 and the second conductive region 320, the light-emitting structure 110 (see FIG. 1) of each of the light-emitting elements 1 may be forward-biased. Thus, each of the light-emitting elements 1 may emit light.

Referring to FIG. 27, the phosphor layers 340 and the second transparent resin 350 may be formed in a linear manner. For example, when the light-emitting elements 1 are arranged in the direction in which the first conductive region 310 extends, the phosphor layers 340 and the second transparent resin 350 may also extend in the direction in which the first conductive region 310 extends. In addition, the phosphors 340 and the second transparent resin 350 may completely surround the first conductive region 310 and the second conductive region 320.

Referring to FIG. 28, the phosphor layers 340 and the second transparent resin 350 may be formed in a dotted manner. In this case, each of the phosphor layers 340 and each of the second transparent resin 350 may surround a corresponding one of the elements 1.

Figure 29:
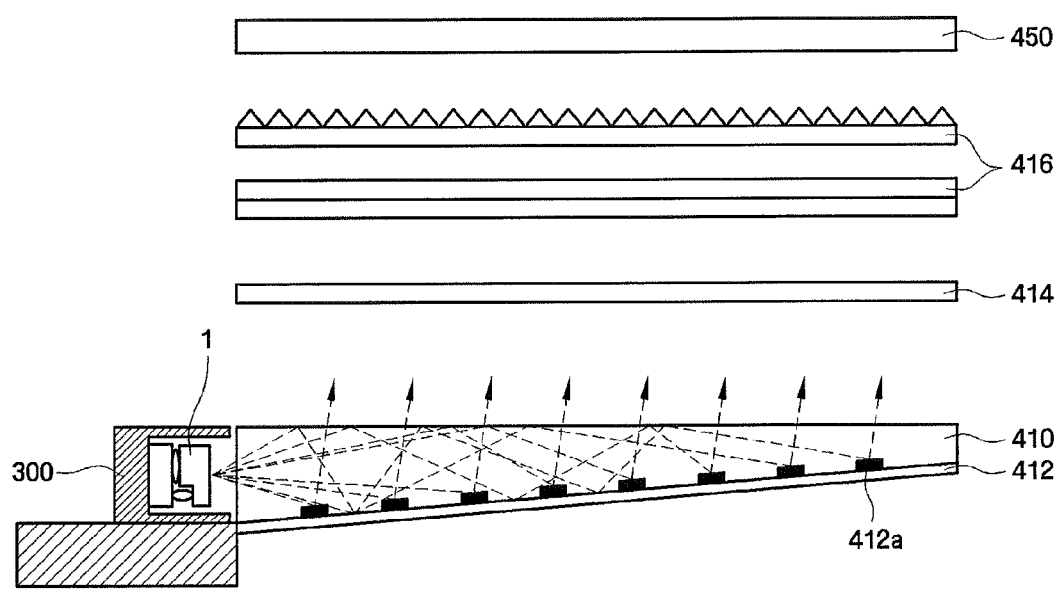
FIG. 29 is a view for explaining a ninth exemplary embodiment of a light-emitting device according to aspects of the present invention.

FIG. 29 is a view for explaining a ninth exemplary embodiment of a light-emitting device according to aspects of the present invention. Specifically, the light-emitting device shown in FIG. 29 is an end product. The light-emitting device of FIG. 29 can be applied to various apparatuses, such as lighting apparatuses, display apparatuses, and mobile apparatuses (mobile phones, MP3 players, navigations, etc.). The light-emitting device shown in FIG. 29 is an edge-type backlight unit (BLU) used in a liquid crystal display (LCD). Since LCDs are not self-luminous, they use a BLU as their light source. Generally, a BLU is disposed behind a liquid crystal panel and provides light to the liquid crystal panel.

Referring to FIG. 29, the BLU includes the light-emitting element 1 according to the first exemplary embodiment, a light guide plate 410, a reflective plate 412, a diffusion sheet 414, and a pair of prism sheets 416. The light-emitting element 1 provides light and may be of a side-view type.

The light guide plate 410 guides light toward a liquid crystal panel 450. The light guide plate 410 is a panel made of a transparent plastic material such as acryl and guides light emitted from the light-emitting device toward the liquid crystal panel 450, which is disposed above the light guide plate 410. Thus, various patterns 412a are printed at the back of the light guide plate 410 to guide light, which is input to the light guide plate 410, toward the liquid crystal panel 450.

The reflective plate 412 is disposed on a lower surface of the light guide plate 410 and thus reflects upward light that is emitted downward from the light guide plate 410. That is, the reflective plate 412 reflects light, which is not reflected by the various patterns 412a printed at the back of the light guide plate 410, toward an output surface of the light guide plate 410. In so doing, the reflective plate 412 reduces light loss and improves the uniformity of light which is output from the output surface of the light guide plate 410.

The diffusion sheet 414 diffuses light output from the light guide plate 410, thereby preventing the light from being concentrated in a specific area.

Each of the prism sheets 416 has a predetermined array of triangular prisms on an upper surface thereof. The prism sheets 416 typically consist of two sheets, and an array of triangular prisms formed on one of the two prism sheets 416 crosses an array of triangular prisms formed on the other one of the two prism sheets 416 at a predetermined angle so that light diffused by the diffusion sheet 414 can proceed in a direction perpendicular to the liquid crystal panel 450.

Figure 30:
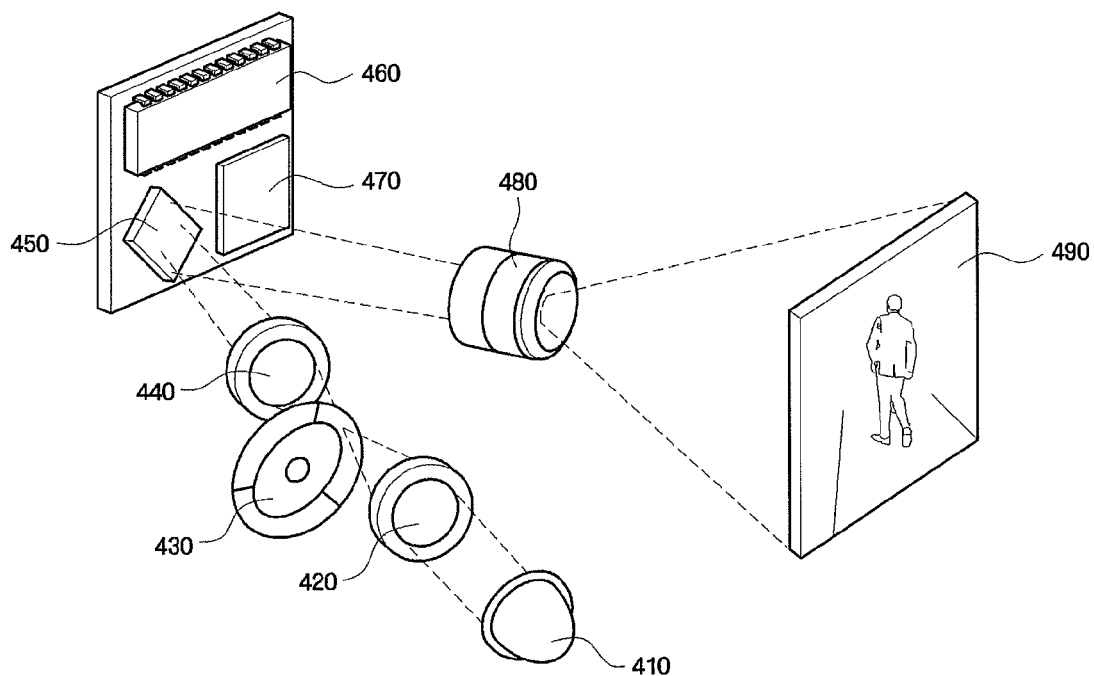
FIGS. 30 through 33 are views for explaining tenth through thirteenth exemplary embodiments of light-emitting devices according to aspects of the present invention.
Figure 31:
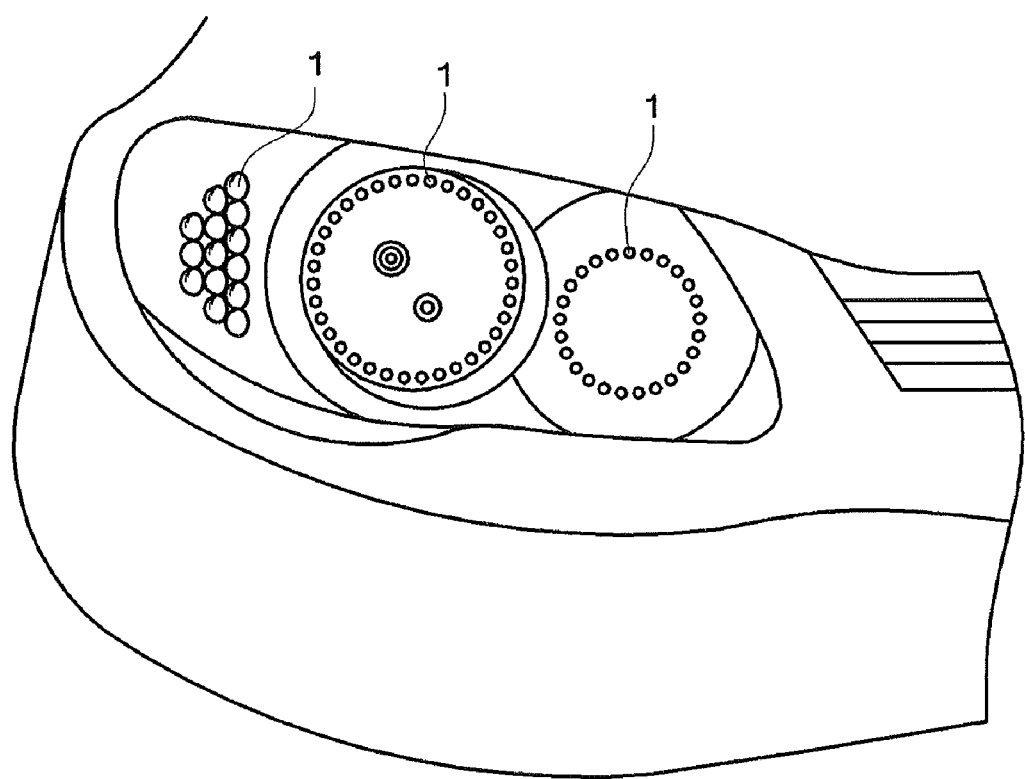
Figure 32:
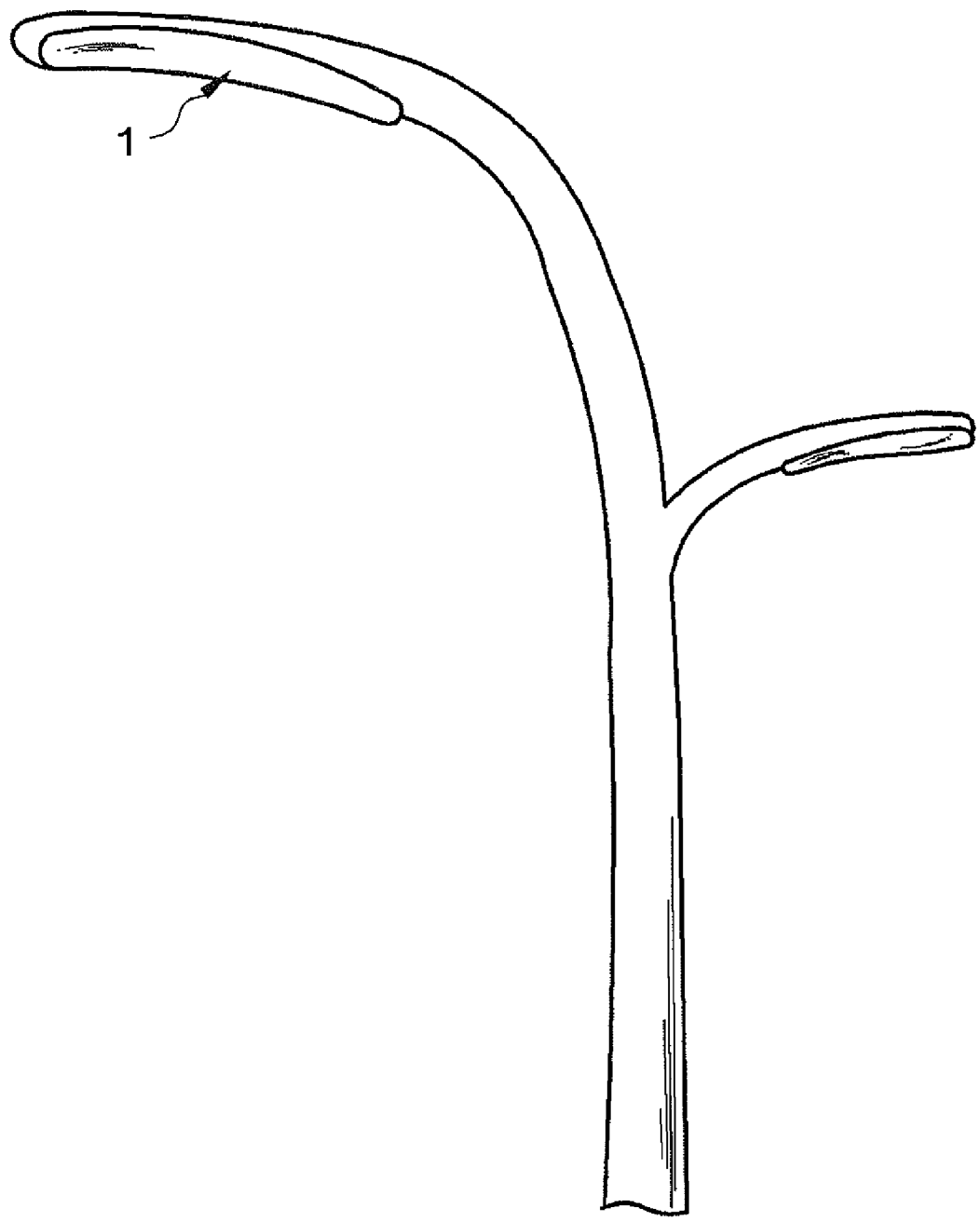
Figure 33:
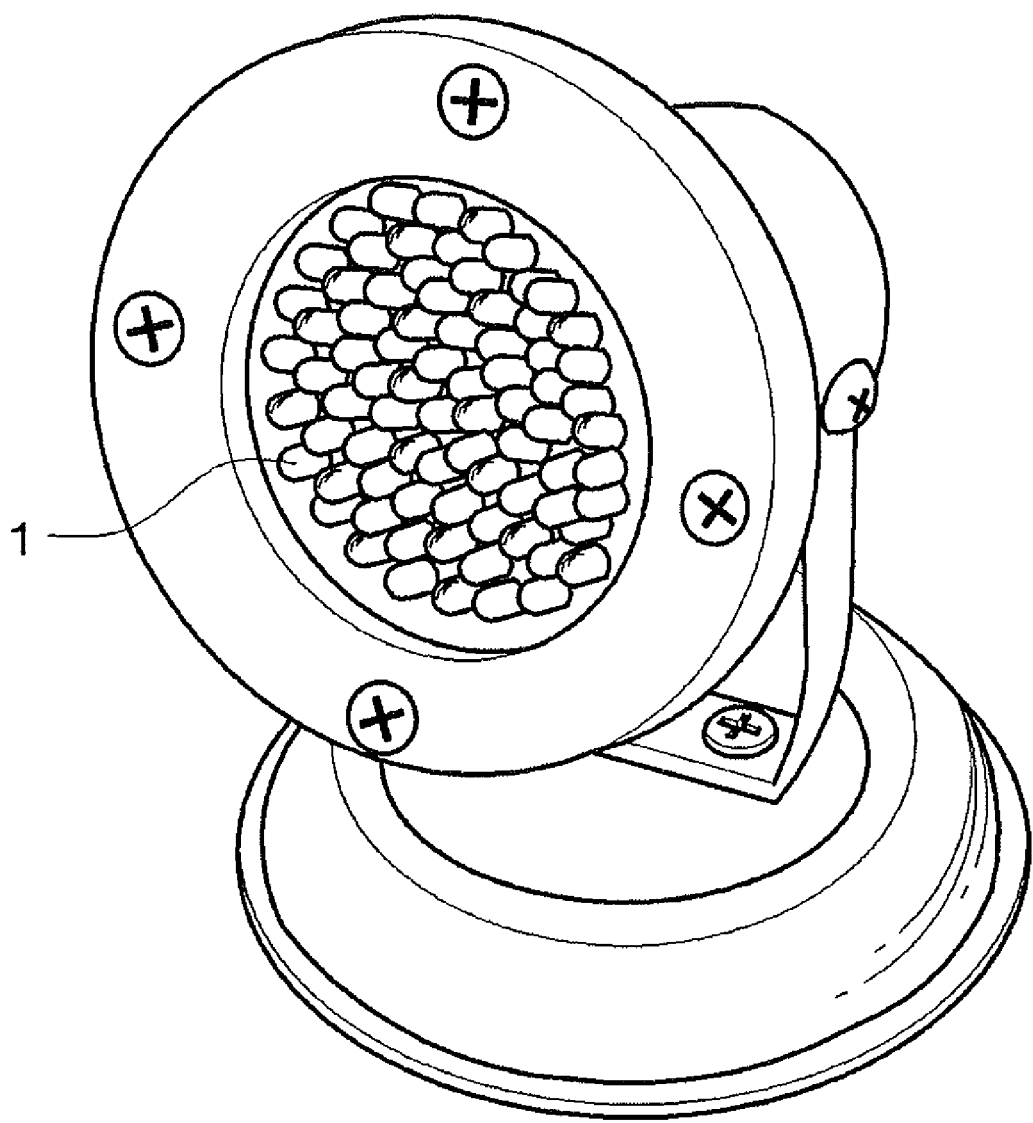

FIGS. 30 through 33 are views for explaining tenth through thirteenth exemplary embodiments of light-emitting devices according to aspects of the present invention. FIGS. 30 through 33 show exemplary end products to which the light-emitting devices according to the tenth through thirteenth exemplary embodiments can be applied. Specifically, FIG. 30 shows a projector, FIG. 31 shows a headlight of a vehicle, FIG. 32 shows a streetlight, and FIG. 33 shows a lamp. The light-emitting element 1 used in FIGS. 30 through 33 may be of a top-view type.

Referring to FIG. 30, light emitted from a light source 410 passes through a condensing lens 420, a color filter 430, and a sharpening lens 440. Then, the light is reflected by a digital micro-mirror device 450 and passes through a projection lens 480 to reach a screen 490. A light-emitting element according to the present invention is included in the light source 410 of FIG. 30.

In FIG. 31, an embodiment of a headlight of a vehicle is shown, wherein the light-emitting element 1 can be used in a main beam light, high beam light, and/or directional light.

In FIG. 32, an embodiment of a street light is shown, wherein the light-emitting element 1 can be used. The light emitting element 1 could be used in other forms of roadway lights or signals too, such as traffic signals, crosswalk signals, and so on.

In FIG. 33, an embodiment of a lamp is shown, which could be used on a wide variety of circumstances.

While embodiment in accordance with the present invention have been particularly shown and described, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:
1. A light-emitting element comprising:
    a buffer layer formed on a substrate;
    photonic crystal patterns and a pad pattern formed on the buffer layer, wherein each of the pad pattern and the photonic crystal patterns is made of a metal material, and the pad pattern is physically connected to the photonic crystal patterns;
    a light-emitting structure comprising a first conductive pattern of a first conductivity type, a light-emitting pattern, and a second conductive pattern of a second conductivity type sequentially stacked on the buffer layer;
a first electrode electrically connected to the first conductive pattern; and
a second electrode electrically connected to the second conductive pattern,
wherein the first conductive pattern is wider than the second conductive pattern and the light-emitting pattern and the first conductive pattern has a protruding portion extending in a lateral direction, and the pad pattern is disposed under the protruding portion of the first conductive pattern.

2. A light-emitting element comprising:
a conductive substrate;
a second electrode formed on the conductive substrate;
a light-emitting structure comprising a first conductive pattern of a first conductivity type, a light-emitting pattern, and a second conductive pattern of a second conductivity type sequentially stacked on the second electrode;
photonic crystal patterns and a pad pattern formed on the first conductive pattern, wherein each of the pad pattern and the photonic crystal patterns is made of a metal material, and the pad pattern is physically connected to the photonic crystal patterns;
a buffer layer formed on the first conductive pattern having an opening that exposes at least part of the pad pattern; and
a first electrode which is formed on the exposed portion of the pad pattern,
wherein the first conductive pattern is wider than the second conductive pattern and the light-emitting pattern and the first conductive pattern has a protruding portion extending in a lateral direction, and the pad pattern is disposed under the protruding portion of the first conductive pattern.

3. The element of claim 2, wherein the photonic crystal patterns are formed at substantially the same level as the pad pattern.

4. The element of claim 2, wherein the photonic crystal patterns are a plurality of repetitive patterns, and an interval between every two adjacent ones of the repetitive patterns is $\lambda/4$ when light generated by the light-emitting structure has a wavelength of $\lambda$.

5. The element of claim 2, further comprising:
an opening formed in the protruding portion of the first conductive pattern that exposes the pad pattern; and
an ohmic layer formed on the exposed pad pattern,
wherein the first electrode is formed on the ohmic layer.

6. The element of claim 2, further comprising:
an insulating layer formed on an upper surface and sidewalls of the light-emitting structure;
a first opening that penetrates the insulating layer;
a second opening that penetrates the first conductive pattern and that is narrower than the first opening; and
an ohmic layer that at least partially fills the first opening and the second opening,
wherein the first electrode is formed on the ohmic layer.

7. A light-emitting element comprising:
a conductive substrate;
a second electrode formed on the conductive substrate;
a light-emitting structure comprising a first conductive pattern of a first conductivity type, a light-emitting pattern, and a second conductive pattern of a second conductivity type sequentially stacked on the second electrode;
photonic crystal patterns and a pad pattern formed on the first conductive pattern, wherein each of the pad pattern and the photonic crystal patterns is made of a metal material, and the pad pattern is physically connected to the photonic crystal patterns;
a buffer layer formed on the first conductive pattern having an opening that exposes at least part of the pad pattern; and
a first electrode which is formed on the exposed portion of the pad pattern,
wherein the second electrode is bowl-shaped, and the light-emitting structure is disposed within the second electrode.

8. The element of claim 7, wherein the second electrode has a protrusion, the light-emitting structure is divided into a first side and a second side by the protrusion, the photonic crystal patterns of the first electrode are disposed on the first side of the light-emitting structure, and the pad pattern of the first electrode is disposed on the second side of the light-emitting structure.

* * * * *